US012414380B2

(12) United States Patent
Chuang et al.

(10) Patent No.: US 12,414,380 B2
(45) Date of Patent: Sep. 9, 2025

(54) METHOD FOR FORMING AN INTEGRATED CHIP (IC) INCLUDING FORMING A THROUGH SUBSTRATE VIA (TSV) IN AN ISOLATION STRUCTURE FORMED IN A FIRST OPENING THAT FORMED IN A METAL SUBSTRATE LAYER

(71) Applicant: Taiwan Semiconductor Manufacturing Company, Ltd., Hsinchu (TW)

(72) Inventors: Harry-Hak-Lay Chuang, Zhubei (TW); Hsin Fu Lin, Hsinchu (TW); Chien Hung Liu, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/366,831

(22) Filed: Aug. 8, 2023

(65) Prior Publication Data

US 2023/0387131 A1  Nov. 30, 2023

Related U.S. Application Data

(62) Division of application No. 17/397,160, filed on Aug. 9, 2021.

(Continued)

(51) Int. Cl.
| | | |
|---|---|---|
| *H01L 21/768* | (2006.01) | |
| *H01L 21/762* | (2006.01) | |
| *H01L 23/48* | (2006.01) | |
| *H01L 23/522* | (2006.01) | |
| *H01L 23/528* | (2006.01) | |

(Continued)

(52) U.S. Cl.
CPC ....... *H10D 87/00* (2025.01); *H01L 21/76283* (2013.01); *H01L 21/76898* (2013.01); *H01L 23/481* (2013.01); *H01L 23/5226* (2013.01); *H01L 23/5283* (2013.01); *H01L 23/53228* (2013.01)

(58) Field of Classification Search
CPC .......... H01L 21/7624; H01L 21/76898; H01L 21/84; H01L 23/5226; H01L 27/1207
See application file for complete search history.

(56) References Cited

U.S. PATENT DOCUMENTS

| | | |
|---|---|---|
| 7,402,866 B2 | 7/2008 | Liang et al. |
| 8,525,342 B2 | 9/2013 | Chandrasekaran et al. |

(Continued)

OTHER PUBLICATIONS

Final Office Action dated May 17, 2024, for U.S. Appl. No. 17/397,160.

(Continued)

*Primary Examiner* — Anh D Mai
(74) *Attorney, Agent, or Firm* — Eschweiler & Potashnik, LLC

(57) ABSTRACT

Various embodiments of the present disclosure are directed towards an integrated chip (IC). The IC includes a substrate. The substrate includes a metal layer, a device layer disposed over the metal layer, and an insulating layer disposed vertically between the metal layer and the device layer. A semiconductor device is disposed on the device layer. An interlayer dielectric (ILD) layer is disposed over the semiconductor device and the substrate.

20 Claims, 15 Drawing Sheets

Related U.S. Application Data

(60) Provisional application No. 63/214,846, filed on Jun. 25, 2021.

(51) Int. Cl.
*H01L 23/532* (2006.01)
*H10D 87/00* (2025.01)

(56) References Cited

U.S. PATENT DOCUMENTS

| | | | |
|---|---|---|---|
| 11,049,870 | B2 | 6/2021 | Sugisaki |
| 2004/0232554 | A1 | 11/2004 | Hirano et al. |
| 2007/0267698 | A1* | 11/2007 | Bernstein .............. H01L 23/481 |
| | | | 257/E27.06 |
| 2009/0152602 | A1* | 6/2009 | Akiyama .............. H01L 23/481 |
| | | | 257/E21.597 |
| 2009/0297091 | A1* | 12/2009 | Assefa ................ H01L 27/0688 |
| | | | 257/351 |
| 2010/0093169 | A1* | 4/2010 | Kuo .................. H01L 21/76898 |
| | | | 438/667 |
| 2010/0224876 | A1* | 9/2010 | Zhu ...................... H01L 23/481 |
| | | | 257/E21.597 |
| 2011/0260248 | A1 | 10/2011 | Smeys et al. |
| 2015/0061020 | A1* | 3/2015 | Yokoyama .......... H01L 27/1211 |
| | | | 438/666 |
| 2015/0104925 | A1* | 4/2015 | Chen ................. H01L 21/76224 |
| | | | 438/424 |
| 2016/0141274 | A1 | 5/2016 | Or-Bach et al. |
| 2017/0229367 | A1* | 8/2017 | Ge .................... H01L 21/76264 |
| 2017/0301611 | A1* | 10/2017 | Cheng ............... H01L 21/76898 |
| 2020/0098776 | A1* | 3/2020 | Sugisaki ................ H10B 43/40 |
| 2021/0118937 | A1* | 4/2021 | Tsugawa ........... H01L 27/14612 |
| 2021/0125852 | A1 | 4/2021 | Or-Bach et al. |
| 2021/0167056 | A1 | 6/2021 | Or-Bach et al. |
| 2022/0359269 | A1 | 11/2022 | Chuang et al. |
| 2022/0406886 | A1* | 12/2022 | Chuang ............. H01L 21/76283 |
| 2022/0415930 | A1* | 12/2022 | Chuang ................ H01L 23/481 |

OTHER PUBLICATIONS

Non-Final Office Action dated Nov. 14, 2023, for U.S. Appl. No. 17/397,160.

Non-Final Office Action dated Jan. 31, 2023 for U.S. Appl. No. 17/397,160.

Final Office Action dated Aug. 3, 2023 for U.S. Appl. No. 17/397,160.

Non-Final Office Action dated Oct. 17, 2024 for U.S. Appl. No. 17/397,160.

Notice of Allowance dated May 5, 2025 for U.S. Appl. No. 17/397,160.

* cited by examiner

METHOD FOR FORMING AN INTEGRATED CHIP (IC) INCLUDING FORMING A THROUGH SUBSTRATE VIA (TSV) IN AN ISOLATION STRUCTURE FORMED IN A FIRST OPENING THAT FORMED IN A METAL SUBSTRATE LAYER

REFERENCE TO RELATED APPLICATIONS

This application is a Divisional of U.S. application Ser. No. 17/397,160, filed on Aug. 9, 2021, which claims the benefit of U.S. Provisional Application No. 63/214,846, filed on Jun. 25, 2021. The contents of the above-referenced patent applications are hereby incorporated by reference in their entirety.

BACKGROUND

Semiconductor devices are electronic components that exploit electronic properties of semiconductor materials to affect electrons or their associated fields. A widely used type of semiconductor device is metal-oxide-semiconductor field-effect transistor (MOSFET). Semiconductor devices have traditionally been formed on bulk semiconductor substrates. In recent years, semiconductor-on-insulator (SOI) substrates have emerged as an alternative to bulk semiconductor substrates. Among other things, an SOI substrate leads to reduced parasitic capacitance, reduced leakage current, reduced latch up, and improved semiconductor device performance (e.g., lower power consumption and higher switching speed).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
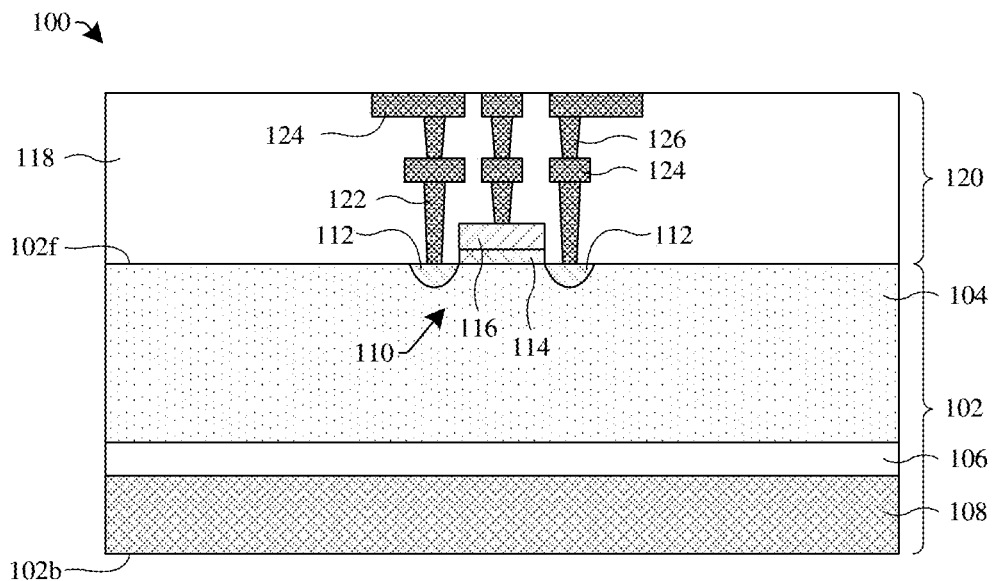
FIG. 1 illustrates a cross-sectional view of some embodiments of an integrated chip (IC) comprising a low-cost semiconductor-on-insulator (SOI) structure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some integrated chips (ICs) comprise a plurality of semiconductor devices (e.g., insulated gate field-effect transistors (IGFETs)) disposed over/within a semiconductor-on-insulator (SOI) substrate. Typically, the SOI substrate comprises an insulating layer vertically separating a first semiconductor layer from a second semiconductor layer. Generally, the typical SOI substrate is formed via an SOI bonding process (e.g., bonding the second semiconductor layer to the insulating layer). The SOI bonding process is expensive, which increases the cost to fabricate an IC with the SOI substrate. Thus, a low-cost alternative to the typical SOI substrate is desirable to reduce the cost to manufacture ICs that utilize the benefits of SOI substrates.

Various embodiments of the present disclosure are directed toward an integrated chip (IC) comprising a low-cost SOI structure (e.g., low-cost SOI substrate). The low-cost SOI structure comprises a device layer, an insulating layer, and a metal layer. The device layer is disposed over both the insulating layer and the metal layer, and the insulating layer vertically separates the metal layer from the device layer. A semiconductor device (e.g., IGFET) is disposed on/over the device layer, over the insulating layer, and over the metal layer.

The IC comprising the low-cost SOI structure may cost less to fabricate than an IC comprising a typical SOI substrate due to the low-cost SOI structure being formed without the expensive SOI bonding process. More specifically, the low-cost SOI structure is formed by forming the metal layer over the insulating layer, which costs less than the expensive SOI bonding process. As such, the low-cost SOI structure may provide a low-cost alternative to the typical SOI substrate.

FIG. 1 illustrates a cross-sectional view 100 of some embodiments of an integrated chip (IC) comprising a low-cost semiconductor-on-insulator (SOI) structure 102.

As shown in the cross-sectional view 100 of FIG. 1, the IC comprises the low-cost SOI structure 102 (e.g., a low-cost SOI substrate). The low-cost SOI structure 102 comprises a device layer 104, an insulating layer 106, and a metal layer 108. The device layer 104 is disposed over the insulating layer 106 and the metal layer 108. The insulating layer 106 is disposed vertically between the metal layer 108 and the device layer 104. The insulating layer 106 vertically separates the metal layer 108 from the device layer 104. In some embodiments, the low-cost SOI structure 102 is referred to as a substrate (and/or an SOI substrate).

The device layer 104 is a semiconductor material. The semiconductor material may be or comprise, for example, silicon (Si), germanium (Ge), silicon-germanium (SiGe), gallium arsenide (GaAs), some other semiconductor material, or a combination of the foregoing. In some embodiments, the device layer 104 is silicon (Si). In further embodiments, the device layer 104 is monocrystalline silicon. In some embodiments, the device layer has a thickness between about 2 micrometers (μm) and about 15 μm. In yet further embodiments, an upper surface of the device layer 104 defines a front-side 102f of the low-cost SOI structure 102.

The insulating layer 106 is configured to electrically isolate the device layer 104 from the metal layer 108. The insulating layer 106 may be or comprise, for example, a low-k dielectric (e.g., a dielectric material with a dielectric constant less than about 3.9), a high-k dielectric material (e.g., a dielectric material with a dielectric constant greater than about 3.9, such as, hafnium oxide (HfO), tantalum oxide (TaO), hafnium silicon oxide (HfSiO), hafnium tantalum oxide (HfTaO), aluminum oxide (AlO), zirconium oxide (ZrO), or the like, an oxide (e.g., silicon dioxide ($SiO_2$)), a nitride (e.g., silicon nitride (SiN)), an oxy-nitride (e.g., silicon oxy-nitride (SiON)), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), some other dielectric material, or a combination of the foregoing. In some embodiments, the insulating layer 106 has a thickness between about 0.5 μm and about 3 μm.

The metal layer 108 is disposed below both the insulating layer 106 and the device layer 104. The metal layer 108 may be or comprise, for example, copper (Cu), aluminum (Al), tungsten (W), gold (Au), silver (Ag), platinum (Pt), some other metal, or a combination of the foregoing. In some embodiments, the metal layer 108 has a thickness between about 1 μm and about 5 μm. In further embodiments, a lower surface of the metal layer 108 defines a back-side 102b of the low-cost SOI structure 102. In some embodiments, the metal layer 108 contacts (e.g., directly contacts) the insulating layer 106. In further embodiments, the insulating layer 106 contacts (e.g., directly contacts) the device layer 104.

A semiconductor device 110 (e.g., insulated gate field-effect transistors (IGFETs)) is disposed on/over the device layer 104. For example, the semiconductor device 110 comprises a pair of source/drain regions 112, a gate dielectric 114, and a gate electrode 116. The pair of source/drain regions 112 are regions of the device layer 104 having a first doping type (e.g., n-type).

The gate dielectric 114 is disposed over the device layer 104 and between the source/drain regions of the pair of source/drain regions 112. The gate electrode 116 overlies the gate dielectric 114. In some embodiments, the gate dielectric 114 and the gate electrode 116 are collectively referred to as a gate stack. In some embodiments, the gate electrode 116 is or comprises polysilicon. In such embodiments, the gate dielectric 114 may be or comprise, for example, an oxide (e.g., silicon dioxide ($SiO_2$)). In other embodiments, the gate electrode 116 may be or comprise a metal, such as aluminum (Al), copper (Cu), titanium (Ti), tantalum (Ta), tungsten (W), molybdenum (Mo), cobalt (Co), or the like. In such embodiments, the gate dielectric 114 may be or comprise a high-k dielectric material, such as hafnium oxide (HfO), tantalum oxide (TaO), hafnium silicon oxide (HfSiO), hafnium tantalum oxide (HfTaO), aluminum oxide (AlO), zirconium oxide (ZrO), or the like.

An interlayer dielectric (ILD) structure 118 is disposed over both the semiconductor device 110 and the low-cost SOI structure 102. The ILD structure 118 comprises one or more stacked ILD layers, which may respectively comprise a low-k dielectric (e.g., a dielectric material with a dielectric constant less than about 3.9), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), or the like.

An interconnect structure 120 (e.g., metal interconnect) is disposed in the ILD structure 118 and over the low-cost SOI structure 102. The interconnect structure 120 comprises a plurality of conductive contacts 122 (e.g., metal contacts), a first plurality of conductive lines 124 (e.g., metal wires), and a plurality of conductive vias 126 (e.g., metal vias). The conductive contacts 122 extend through the ILD structure 118 to contact the pair of source/drain regions 112 and the gate electrode 116. The first plurality of conductive lines 124 and the plurality of conductive vias 126 are disposed over the conductive contacts 122 and alternate back and forth from the conductive contacts 122 toward an upper surface of the ILD structure 118. For clarity in the figures, only some of the plurality of conductive contacts 122, some of the first plurality of conductive lines 124, and some of the plurality of conductive vias 126 are labeled in the figures.

The interconnect structure 120 is embedded in the ILD structure 118 and is configured to provide electrical connections between various devices of the IC. In other words, the first plurality of conductive lines 124, the plurality of conductive vias 126, and the plurality of conductive contacts 122 are electrically coupled together in a predefined manner and are configured to provide electrical connections between the various devices of the IC. In some embodiments, the first plurality of conductive lines 124 and the plurality of conductive vias 126 may be or comprise, for example, copper (Cu), aluminum (Al), gold (Au), silver (Ag), platinum (Pt), or the like. In further embodiments, the plurality of conductive contacts 122 may be or comprise, for example, tungsten (W), copper (Cu), aluminum (Al), or the like.

The IC comprising the low-cost SOI structure 102 may cost less to fabricate than an IC comprising a typical SOI substrate due to the low-cost SOI structure 102 being formed without an expensive SOI bonding process. More specifically, the low-cost SOI structure 102 is formed by forming the metal layer 108 over the insulating layer 106 (described in more detail hereinafter), which is less expensive than the SOI bonding process.

Further, even though the low-cost SOI structure 102 costs less to fabricate than the typical SOI substrate, the low-cost SOI structure 102 may provide substantially similar performance as the typical SOI substrate. More specifically, because the substrate comprises the metal layer 108, and because the insulating layer 106 vertically separates the metal layer 108 from the device layer 104, the metal layer 108 may be biased (e.g., applying a specific current and/or voltage to the metal layer 108), thereby improving the performance of the semiconductor device 110 (e.g., increased switching speed, reduced leakage current, etc.). As such, the low-cost SOI structure 102 provides substantially similar performance improvements as the typical SOI substrate while costing less to fabricate. Thus, the low-cost SOI structure 102 may be a low-cost alternative to the typical SOI substrate.

Figure 2:
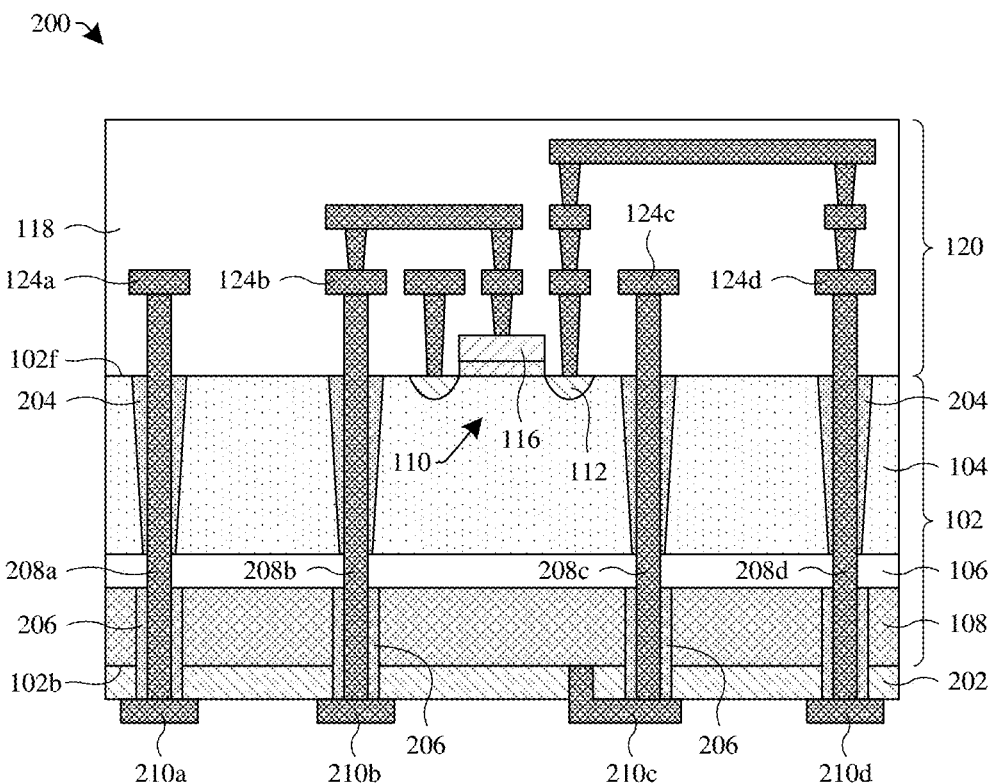
FIG. 2 illustrates a cross-sectional view of some more detailed embodiments of the IC of FIG. 1.

FIG. 2 illustrates a cross-sectional view 200 of some more detailed embodiments of the IC of FIG. 1.

As shown in the cross-sectional view 200 of FIG. 2, a dielectric layer 202 is disposed below the low-cost SOI structure 102. The metal layer 108 is disposed vertically between the dielectric layer 202 and the insulating layer 106. In some embodiments, the dielectric layer 202 contacts (e.g., directly contacts) the metal layer 108. In some embodiments, the dielectric layer 202 is or comprises, for example, a low-k dielectric (e.g., a dielectric material with a dielectric constant less than about 3.9), a high-k dielectric material (e.g., a dielectric material with a dielectric constant greater than about 3.9, such as, hafnium oxide (HfO), tantalum oxide (TaO), hafnium silicon oxide (HfSiO), hafnium tantalum oxide (HfTaO), aluminum oxide (AlO), zirconium oxide (ZrO), or the like), an oxide (e.g., $SiO_2$), a nitride (e.g., SiN), an oxy-nitride (e.g., SiON), undoped silicate glass (USG), doped silicon dioxide (e.g., carbon doped silicon dioxide), borosilicate glass (BSG), phosphoric silicate glass (PSG), borophosphosilicate glass (BPSG), fluorinated silicate glass (FSG), a spin-on glass (SOG), some other dielectric material, or a combination of the foregoing.

In some embodiments, the dielectric layer 202 is or comprises a same material as the insulating layer 106. For example, the dielectric layer 202 and the insulating layer 106 are borophosphosilicate glass (BPSG). In further embodiments, the insulating layer 106 and the ILD structure 118 are or comprise a same material. For example, the insulating layer 106 and the ILD structure 118 are borophosphosilicate glass (BPSG).

A plurality of first isolation structures 204 are disposed in the device layer 104. In some embodiments, the first isolation structures 204 extend into the device layer 104 from the front-side 102f of the low-cost SOI structure 102. The first isolation structures 204 may have angled sidewalls. In other embodiments, the sidewalls of the first isolation structures 204 may be substantially straight (e.g., vertical). The first isolation structures 204 extend vertically through the device layer 104 to the insulating layer 106. The first isolation structures 204 have lower surfaces (e.g., lowermost surfaces) that contact (e.g., directly contact) the insulating layer 106. In some embodiments, the first isolation structures 204 may be or comprise, for example, an oxide (e.g., SiO2), a nitride (e.g., SiN), an oxy-nitride (e.g., SiON), a carbide (e.g., silicon carbide (SiC)), some other dielectric material, or a combination of the foregoing.

A plurality of second isolation structures 206 are disposed in metal layer 108 and the dielectric layer 202. The second isolation structures 206 extend vertically through the dielectric layer 202 and vertically through the metal layer 108 to the insulating layer 106. The second isolation structures 206 have upper surfaces (e.g., uppermost surfaces) that contact (e.g., directly contact) the insulating layer 106. The second isolation structures 206 and the first isolation structures 204 are laterally aligned (e.g., centered laterally), respectively. In some embodiments, the second isolation structures 206 may be or comprise, for example, an oxide (e.g., SiO2), a nitride (e.g., SiN), an oxy-nitride (e.g., SiON), a carbide (e.g., SiC), some other dielectric material, or a combination of the foregoing.

A plurality of through-substrate vias (TSVs) 208a-d extend vertically through the device layer 104. For example, the plurality of TSVs 208a-d comprise a first TSV 208a, a second TSV 208b, a third TSV 208c, and a fourth TSV 208d that each extend vertically through the device layer 104. The TSVs 208a-d also extend vertically through the first isolation structures 204, respectively. In other words, the TSVs 208a-d extend through the device layer 104 by extending vertically through the first isolation structures 204. In some embodiments, the TSVs 208a-d may be or comprise, for example, copper (Cu), aluminum (Al), gold (Au), silver (Ag), platinum (Pt), or the like. In further embodiments, the TSVs 208a-d are referred to as back-side TSVs (BTSV).

The first isolation structures 204 laterally surround the TSVs 208a-d, respectively. The first isolation structures 204 are configured to electrically isolate the TSVs 208a-d from the device layer 104. For example, a first one of the first isolation structures 204 laterally surrounds the first TSV 208a and is configured to electrically isolate the first TSV 208a from the device layer 104. The TSVs 208a-d also extend vertically through the insulating layer 106.

In some embodiments, the TSVs 208a-d also extend vertically through the metal layer 108. In further embodiments, the TSVs 208a-d extend vertically through the second isolation structures 206, respectively. In other words, the TSVs 208a-d extend through the metal layer 108 by extending vertically through the second isolation structures 206.

The second isolation structures 206 laterally surround the TSVs 208a-d, respectively. The second isolation structures 206 are configured to electrically isolate the TSVs 208a-d from the metal layer 108. For example, a first one of the second isolation structures 206 laterally surrounds the first TSV 208a and is configured to electrically isolate the first TSV 208a from the metal layer 108. In some embodiments, the TSVs 208a-d also extend vertically through the dielectric layer 202. In further embodiments, the TSVs 208a-d extend through the dielectric layer 202 by extending vertically through the second isolation structures 206.

The TSVs 208a-d also extend vertically through a portion of the ILD structure 118. The TSVs 208a-d extend vertically through the portion of the ILD structure 118 to corresponding conductive features of the interconnect structure 120. The TSVs 208a-d are electrically coupled to the corresponding conductive features of the interconnect structure 120, respectively. For example, the first TSV 208a extends vertically through the portion of the ILD structure 118 to a first conductive line 124a of the first plurality of conductive lines 124, the second TSV 208b extends vertically through the portion of the ILD structure 118 to a second conductive line 124b of the first plurality of conductive lines 124, the third TSV 208c extends vertically through the portion of the ILD structure 118 to a third conductive line 124c of the first plurality of conductive lines 124, and the fourth TSV 208d extends vertically through the portion of the ILD structure 118 to a fourth conductive line 124d of the first plurality of conductive lines 124.

A second plurality of conductive lines 210a-d (e.g., metal lines) are disposed below the low-cost SOI structure 102 and the dielectric layer 202. The second plurality of conductive lines 210a-d are, at least partially, vertically separated from the metal layer 108 by the dielectric layer 202. The TSVs 208a-d extend vertically from the corresponding conductive features of the interconnect structure 120 to corresponding conductive lines of the second plurality of conductive lines 210a-d. The TSVs 208a-d are electrically coupled to their corresponding conductive line of the second plurality of conductive lines 210a-d. For example, the first TSV 208a extends vertically from the first conductive line 124a of the first plurality of conductive lines 124 to a first conductive line 210a of the second plurality of conductive lines 210, the second TSV 208b extends vertically from the second conductive line 124b of the first plurality of conductive lines 124 to a second conductive line 210b of the second plurality of conductive lines 210, the third TSV 208c extends vertically from the third conductive line 124c of the first plurality of conductive lines 124 to a third conductive line 210c of the second plurality of conductive lines 210, and the fourth TSV 208d extends vertically from the fourth conductive line 124d of the first plurality of conductive lines 124 to a fourth conductive line 210d of the second plurality of conductive lines 210.

Also shown in the cross-sectional view 200 of FIG. 2, the TSVs 208a-d electrically couple their corresponding conductive feature of the interconnect structure 120 to their corresponding conductive line of the second plurality of conductive lines 210a-d. For example, the first TSV 208a electrically couples the first conductive line 124a of the first plurality of conductive lines 124 to the first conductive line 210a of the second plurality of conductive lines 210, the second TSV 208b electrically couples the second conductive line 124b of the first plurality of conductive lines 124 to the second conductive line 210b of the second plurality of conductive lines 210, the third TSV 208c electrically couples the third conductive line 124c of the first plurality of conductive lines 124 to the third conductive line 210c of the second plurality of conductive lines 210, and the fourth TSV 208d electrically couples the fourth conductive line 124d of the first plurality of conductive lines 124 to the fourth conductive line 210d of the second plurality of conductive lines 210. As such, corresponding voltages (or currents) may be applied to the TSVs 208a-d to specific features of the IC by applying the corresponding voltages to the second plurality of conductive lines 210a-d, and/or vice versa.

For example, as shown in the cross-sectional view 200 of FIG. 2, the second conductive line 210b of the second plurality of conductive lines 210 may be electrically coupled to the gate electrode 116 of the semiconductor device 110 (e.g., via the second TSV 208b, the second conductive line 124b, etc.). Thus, a first voltage (or current) may be applied to the gate electrode 116 of the semiconductor device 110 by applying the first voltage (or current) to the second conductive line 210b of the second plurality of conductive lines 210. Further, the source/drain regions of the pair of source/drain regions 112 may be electrically coupled to corresponding ones of the second plurality of conductive lines 210. For example, as shown in the cross-sectional view 200 of FIG. 2, the fourth conductive line 210d of the second plurality of conductive lines 210 may be electrically coupled to one of the source/drain regions of the plurality of source/drain regions 112 (e.g., via the fourth TSV 208d, the fourth conductive line 124d, etc.). Thus, a second voltage (or current) may be applied to the one of the source/drain regions of the plurality of source/drain regions 112 by applying the second voltage (or current) to the fourth conductive line 210d of the second plurality of conductive lines 210, and/or vice versa. Moreover, as shown in the cross-sectional view 200 of FIG. 2, the third conductive line 210c of the second plurality of conductive lines 210 may be electrically coupled to the third conductive line 124c of the first plurality of conductive lines 124 (e.g., via the third TSV 208c). Thus, a third voltage (or current) may be applied to the third conductive line 124c of the first plurality of conductive lines 124 by applying the third voltage (or current) to the third conductive line 210c of the second plurality of conductive lines 210, and/or vice versa.

In some embodiments, the second plurality of conductive lines 210a-d may be or comprise, for example, copper (Cu), aluminum (Al), gold (Au), silver (Ag), platinum (Pt), or the like. In further embodiments, the second plurality of conductive lines 210a-d and the TSVs 208a-d may be or comprise a same material. For example, the second plurality of conductive lines 210a-d and the TSVs 208a-d may be copper (Cu). In other embodiments, the second plurality of conductive lines 210a-d and the TSVs 208a-d may be or comprise a different material. In further embodiments, the second plurality of conductive lines 210a-d are referred to as a redistribution layer (RDL).

The dielectric layer 202 is configured to electrically isolate the second plurality of conductive lines 210a-d from the metal layer 108. In some embodiments, one or more of the second plurality of conductive lines 210 extend through the dielectric layer 202 to the metal layer 108, such that the one or more of the second plurality of conductive lines 210 are electrically coupled to the metal layer 108. Thus, by applying a voltage (or current) to the one or more of the second plurality of conductive lines 210, the metal layer 108 may be biased.

For example, as shown in the cross-sectional view 200 of FIG. 2, the third conductive line 210c has a lateral portion and a vertical portion. The lateral portion of the third conductive line 210c contacts (e.g., directly contacts) the third TSV 208c. The lateral portion of the third conductive line 210c extends laterally below the dielectric layer 202 from the third TSV 208c to a first location. At the first location, the vertical portion of the third conductive line 210c extends vertically from the lateral portion of the third conductive line 210c through the dielectric layer 202 and to the metal layer 108, such that the third conductive line 210c is electrically coupled to the metal layer 108. Thus, the third voltage (or current) may be applied to the metal layer 108 by applying the third voltage (or current) to the third conductive line 210c, and/or a fourth voltage (or current) may be applied to the metal layer 108 by applying the fourth voltage (or current) to the third conductive line 124c. As such, the metal layer 108 may be biased, thereby improving the performance of the semiconductor device 110 (e.g., increased switching speed, reduced leakage current, etc.).

Figure 3:
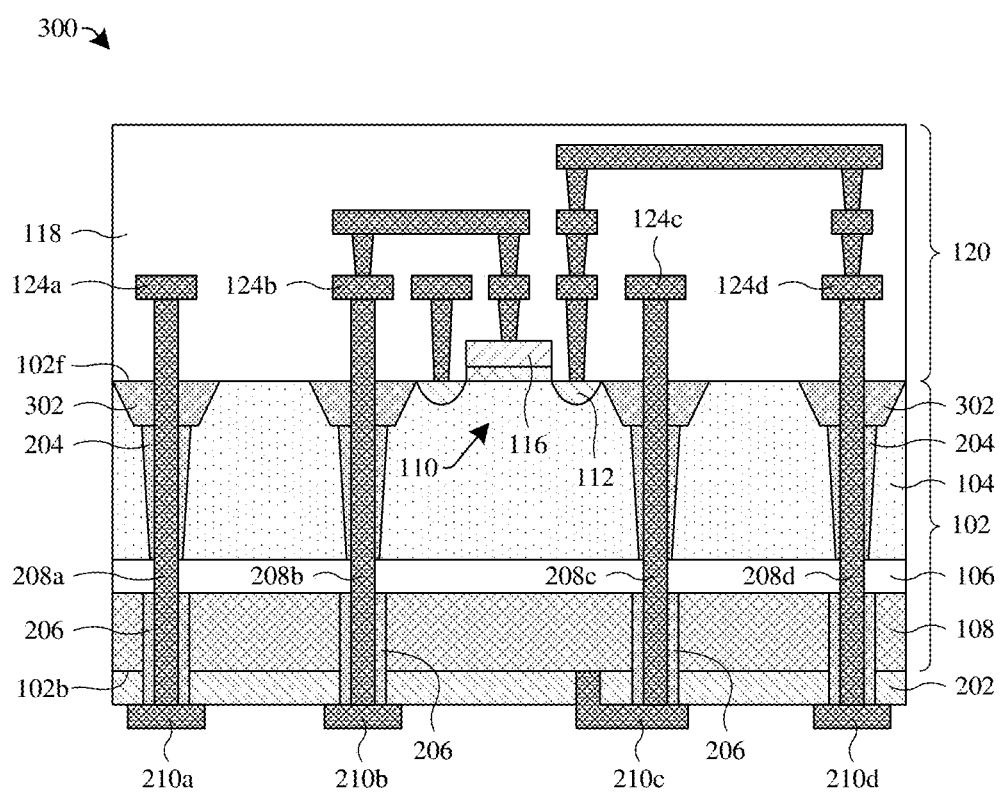
FIG. 3 illustrates a cross-sectional view of some other embodiments of the IC of FIG. 2.

FIG. 3 illustrates a cross-sectional view 300 of some other embodiments of the IC of FIG. 2.

As shown in the cross-sectional view 300 of FIG. 3, a plurality of third isolation structures 302 are disposed in the device layer 104. The third isolation structures 302 and the first isolation structures 204 are laterally aligned (e.g., centered laterally), respectively. The third isolation structures 302 may have angled sidewalls. In other embodiments, the sidewalls of the third isolation structures 302 may be substantially straight (e.g., vertical). In some embodiments, the third isolation structures 302 may be or comprise, for example, an oxide (e.g., SiO2), a nitride (e.g., SiN), an oxy-nitride (e.g., SiON), a carbide (e.g., SiC), some other dielectric material, or a combination of the foregoing.

The third isolation structures 302 extends into the device layer 104 from the front-side 102f of the low-cost SOI structure 102. The third isolation structures 302 extend partially through the device layer 104. The first isolation structures 204 contact (e.g., directly contacts) the third isolation structures 302, respectively. The first isolation structures 204 extend vertically from the third isolation structures 302, respectively, to the insulating layer 106. The TSVs 208a-d extend vertically through the third isolation structures 302, respectively, and the first isolation structures 204, respectively. In other words, the TSVs 208a-d extend through the device layer 104 by extending vertically through both the third isolation structures 302 and the first isolation structures 204.

The third isolation structures 302 laterally surround the TSVs 208a-d, respectively. The third isolation structures 302 are configured to electrically isolate portions of the TSVs 208a-d from the device layer 104, and the first isolation structures 204 are configured to electrically isolate remaining portions of the TSVs 208a-d from the device layer 104. For example, a first one of the third isolation structures 302 laterally surrounds an upper portion of the first TSV 208a and is configured to electrically isolate the upper portion of the first TSV 208a from the device layer 104, and a first one of the first isolation structures 204 laterally surrounds a lower portion of the first TSV 208a and is configured to electrically isolate the lower portion of the first TSV 208a from the device layer 104. In some embodiments, the third isolation structures 302 are referred to as shallow trench isolation (STI) structures. In further embodiments, the first isolation structures 204 are referred to as deep trench isolation (DTI) structures.

Figure 4B:
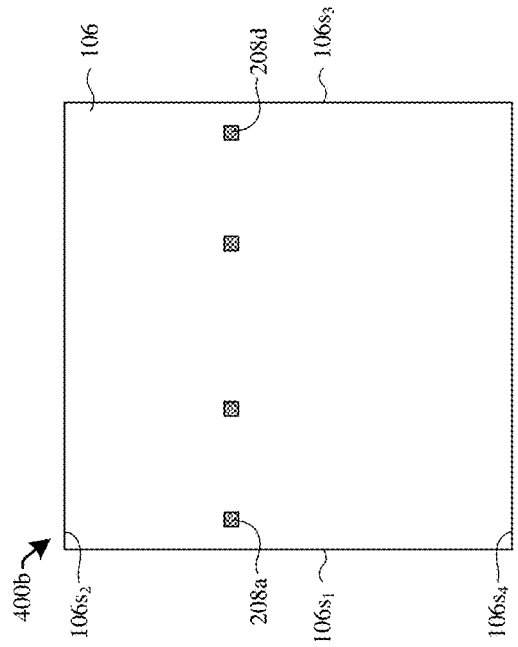
FIGS. 4A-4D illustrate bottom views of some embodiments of the IC of FIG. 3.
Figure 4D:
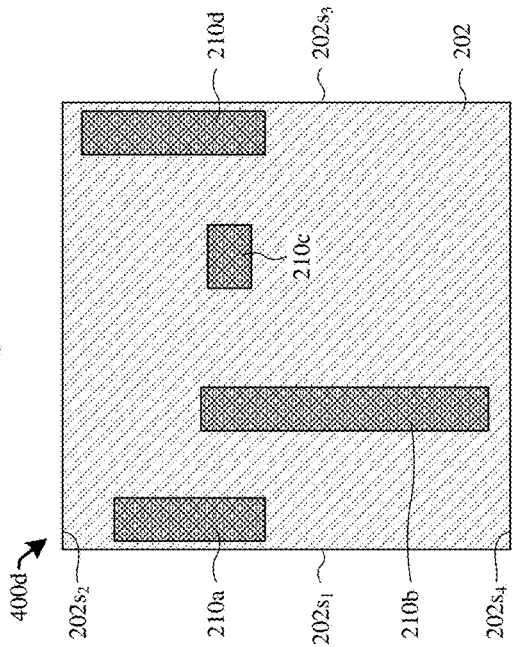
Figure 4A:
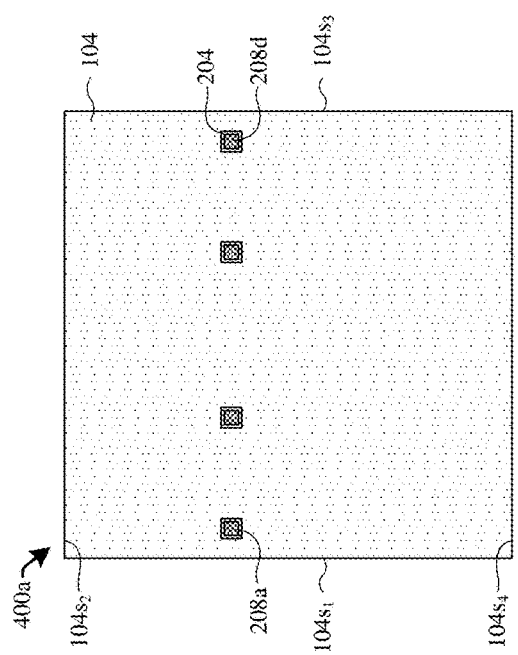
Figure 4C:
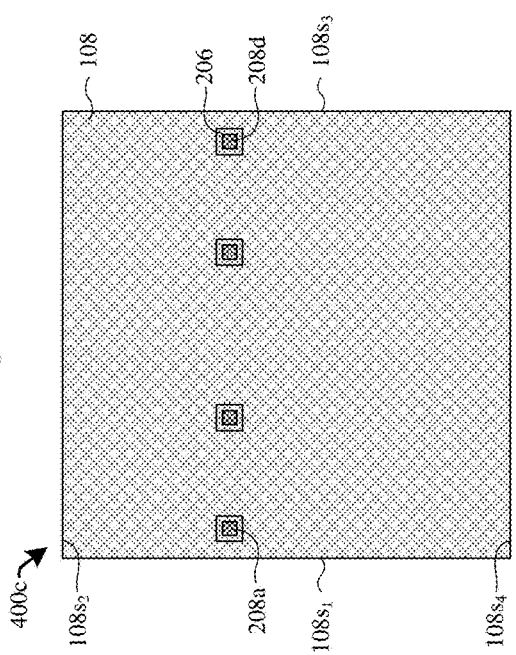

FIGS. 4A-4D illustrate bottom views 400a-d of some embodiments of the IC of FIG. 3. More specifically, FIG. 4A illustrates a bottom view 400a of the device layer 104 of an embodiment of the IC of FIG. 3, FIG. 4B illustrates a bottom view 400b of the insulating layer 106 of the embodiment of the IC of FIG. 3, FIG. 4C illustrates a bottom view 400c of the metal layer 108 of the embodiment of the IC of FIG. 3, and FIG. 4D illustrates a bottom view 400d of the embodiment of the IC of FIG. 3.

As shown in the bottom views 400a-d of FIGS. 4A-4D, the device layer 104 has a plurality of sidewalls $104s_{1-4}$. For example, the plurality of sidewalls $104s_{1-4}$ of the device layer 104 comprises a first sidewall $104s_1$ of the device layer 104, a second sidewall $104s_2$ of the device layer 104, a third sidewall $104s_3$ of the device layer 104, and a fourth sidewall $104s_4$ of the device layer 104. In some embodiments, the plurality of sidewalls $104s_{1-4}$ of the device layer 104 are outermost sidewalls of the device layer 104.

Further, the insulating layer 106 has a plurality of sidewalls $106s_{1-4}$. For example, the plurality of sidewalls $106s_{1-4}$ of the insulating layer 106 comprises a first sidewall $106s_1$ of the insulating layer 106, a second sidewall $106s_2$ of the insulating layer 106, a third sidewall $106s_3$ of the insulating layer 106, and a fourth sidewall $106s_4$ of the insulating layer 106. In some embodiments, the plurality of sidewalls $106s_{1-4}$ of the insulating layer 106 are outermost sidewalls of the insulating layer 106.

In addition, the metal layer 108 has a plurality of sidewalls $108s_{1-4}$. For example, the plurality of sidewalls $108s_{1-4}$ of the metal layer 108 comprises a first sidewall $108s_1$ of the metal layer 108, a second sidewall $108s_2$ of the metal layer 108, a third sidewall $108s_3$ of the metal layer 108, and a fourth sidewall $108s_4$ of the metal layer 108. In some embodiments, the plurality of sidewalls $108s_{1-4}$ of the metal layer 108 are outermost sidewalls of the metal layer 108.

Moreover, the dielectric layer 202 has a plurality of sidewalls $202s_{1-4}$. For example, the plurality of sidewalls $202s_{1-4}$ of the dielectric layer 202 comprises a first sidewall $202s_1$ of the dielectric layer 202, a second sidewall $202s_2$ of the dielectric layer 202, a third sidewall $202s_3$ of the dielectric layer 202, and a fourth sidewall $202s_4$ of the dielectric layer 202. In some embodiments, the plurality of sidewalls $202s_{1-4}$ of the dielectric layer 202 are outermost sidewalls of the dielectric layer 202.

In some embodiments, the plurality of sidewalls $104s_{1-4}$ of the device layer 104, the plurality of sidewalls $106s_{1-4}$ of the insulating layer 106, the plurality of sidewalls $108s_{1-4}$ of the metal layer 108, and the plurality of sidewalls $202s_{1-4}$ of the dielectric layer 202 are substantially aligned (e.g., flush).

For example, the first sidewall $104s_1$ of the device layer 104, the first sidewall $106s_1$ of the insulating layer 106, the first sidewall $108s_1$ of the metal layer 108, and the first sidewall $202s_1$ of the dielectric layer 202 are substantially aligned (e.g., flush) with one another; the second sidewall $104s_2$ of the device layer 104, the second sidewall $106s_2$ of the insulating layer 106, the second sidewall $108s_2$ of the metal layer 108, and the second sidewall $202s_2$ of the dielectric layer 202 are substantially aligned (e.g., flush) with one another; and so forth. In further embodiments, a footprint of the device layer 104, a footprint of the insulating layer 106, a footprint of the metal layer 108, and a footprint of the dielectric layer 202 are substantially the same (e.g., a same width, length, and shape) as one another.

Also shown in the bottom views 400a-d of FIGS. 4A-4D, the conductive lines of the second plurality of conductive lines 210 may be laterally spaced from one another. As such, different voltages (or currents) may be applied to the different conductive lines of the second plurality of conductive lines 210 to selectively apply corresponding voltages (or currents) to specific features of the IC. Although not shown, it will be appreciated that a plurality of input/output (I/O) structures (e.g., bond pads, solder bumps, etc.) may be disposed below (or in plane) with and electrically coupled to the second plurality of conductive lines 210, respectively. In such embodiments, the corresponding voltages (or currents) may be applied to the specific features of the IC via the I/O structures, and/or vice versa.

Figure 5:
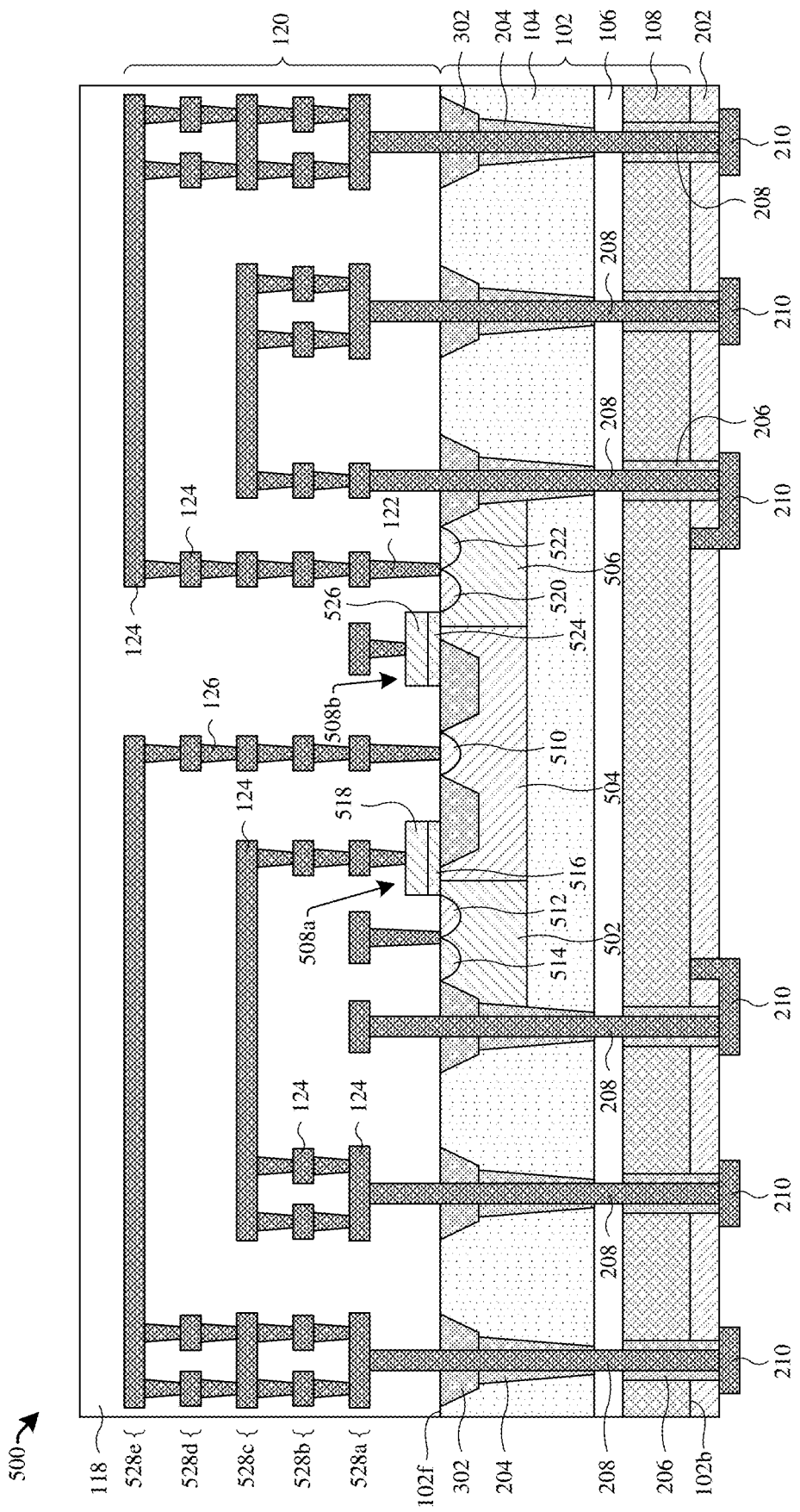
FIG. 5 illustrates a cross-sectional view of some other embodiments of the IC of FIG. 3.

FIG. 5 illustrates a cross-sectional view 500 of some other embodiments of the IC of FIG. 3.

As shown in the cross-sectional view 500 of FIG. 5, a first well region 502 is disposed in the device layer 104. The first well region 502 is a region of the device layer 104 having a second doping type (e.g., p-type). A second well region 504 is also disposed in the device layer 104. The second well region 504 is a region of the device layer 104 having the first doping type (e.g., n-type). A third well region 506 is also disposed in the device layer 104. The third well region 506 is a region of the device layer 104 having the second doping type. The second well region 504 is disposed laterally between the first well region 502 and the third well region 506.

In some embodiments, a plurality of semiconductor devices 508a-b are disposed on/over the device layer 104. For example, a first semiconductor device 508a (e.g., a first double-diffused MOSFET (DMOS)) and a second semiconductor device 508b (e.g., a second DMOS) are disposed on/over the device layer 104. In some embodiments, the first semiconductor device 508a and the second semiconductor device 508b share a common drain region 510. In other embodiments, the first semiconductor device 508a and the second semiconductor device 508b have their own drain regions that are laterally spaced. The drain region 510 is a region of the device layer 104 having the first doping type. The drain region 510 is disposed in the second well region 504. A first one of the plurality of conductive contacts 122 is electrically coupled to the drain region 510.

The first semiconductor device 508a also comprises a source region 512, a body contact region 514, a gate dielectric 516, and a gate electrode 518. The source region 512 is a region of the device layer 104 having the first doping type. The source region 512 is disposed in the first well region 502. The body contact region 514 is a region of the device layer 104 having the second doping type. The body contact region 514 is disposed in the first well region 502. A second one of the plurality of conductive contacts 122 is electrically coupled to both the source region 512 and the body contact region 514. The gate dielectric 516 is disposed over the device layer 104 and laterally between the source region 512 and the drain region 510. The gate electrode 518 overlies the gate dielectric 516. In some embodiments, the gate dielectric 516 partially overlies one of the third isolation structures 302, which is disposed laterally between the source region 512 and the drain region 510. A third one of the plurality of conductive contacts 122 is electrically coupled to the gate electrode 518.

The second semiconductor device 508b also comprises a source region 520, a body contact region 522, a gate dielectric 524, and a gate electrode 526. The source region 520 is a region of the device layer 104 having the first doping type. The source region 520 is disposed in the third well region 506. The body contact region 522 is a region of the device layer 104 having the second doping type. The body contact region 522 is disposed in the third well region 506. A fourth one of the plurality of conductive contacts 122 is electrically coupled to both the source region 520 and the body contact region 522. The gate dielectric 524 is disposed over the device layer 104 and laterally between the source region 520 and the drain region 510. The gate electrode 526 overlies the gate dielectric 524. In some embodiments, the gate dielectric 524 partially overlies another one of the third isolation structures 302, which is disposed laterally between the source region 520 and the drain region 510. A fifth one of the plurality of conductive contacts 122 is electrically coupled to the gate electrode 526.

The first plurality of conductive lines 124 are disposed in a plurality of conductive layers 528a-e (e.g., metal layers). Each of the plurality of conductive layers 528a-e extend laterally through the ILD structure 118. Each of the plurality of conductive layers 528a-e comprise a group of one or more of the first plurality of conductive lines 124. The plurality of conductive layers 528a-e are disposed over one another. The plurality of conductive vias 126 extend vertically between the plurality of conductive layers 528a-e and electrically couple the first plurality of conductive lines 124 of the plurality of conductive layers 528a-e together in a predefined manner.

For example, the plurality of conductive layers 528a-e comprises a first conductive layer 528a (e.g., metal layer 1), a second conductive layer 528b (e.g., metal layer 2), a third conductive layer 528c (e.g., metal layer 3), a fourth conductive layer 528d (e.g., metal layer 4), and a fifth conductive layer 528e (e.g., metal layer 5) disposed in the ILD structure 118. The first conductive layer 528a comprises a first group of conductive lines of the first plurality of conductive lines 124, the second conductive layer 528b comprises a second group of conductive lines of the first plurality of conductive lines 124, the third conductive layer 528c comprises a third group of conductive lines of the first plurality of conductive lines 124, the fourth conductive layer 528d comprises a fourth group of conductive lines of the first plurality of conductive lines 124, and the fifth conductive layer 528e comprises a fifth group of conductive lines of the first plurality of conductive lines 124. The second conductive layer 528b is disposed over the first conductive layer 528a, the third conductive layer 528c is disposed over the second conductive layer 528b, the fourth conductive layer 528d is disposed over the third conductive layer 528c, and the fifth conductive layer 528e is disposed over the fourth conductive layer 528d. In some embodiments, the first conductive layer 528a is disposed nearer the device layer 104 than any other of the plurality of conductive layers 528a-e. In further embodiments, the TSVs 208 are electrically coupled to corresponding conductive lines of the first conductive layer 528a. It will be appreciated that the plurality of conductive layers 528a-e is not limited to only five conductive layers, but rather the plurality of conductive layers 528a-e may comprise any suitable number of conductive layers.

Figure 6:
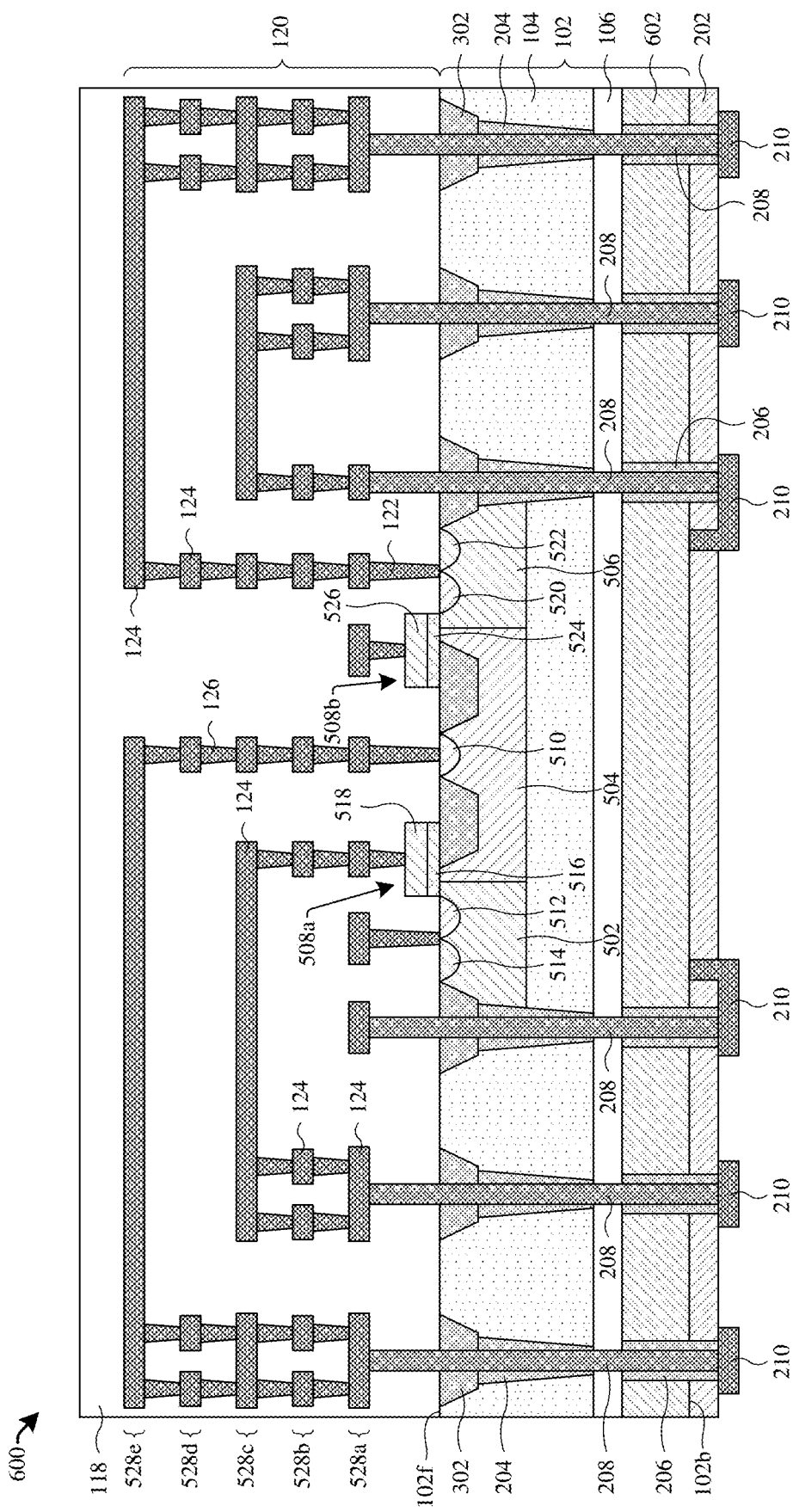
FIG. 6 illustrates a cross-sectional view of some other embodiments of the IC of FIG. 5.

FIG. 6 illustrates a cross-sectional view 600 of some other embodiments of the IC of FIG. 5.

As shown in the cross-sectional view 600 of FIG. 6, the low-cost SOI structure 102 comprises a conductive layer 602. The device layer 104 is disposed over the insulating layer 106 and the conductive layer 602. The insulating layer 106 is disposed vertically between the conductive layer 602 and the device layer 104. The insulating layer 106 vertically separates the conductive layer 602 from the device layer 104. In some embodiments, the conductive layer 602 is utilized in place of the metal layer 108 (e.g., is disposed in the IC in a substantially similar manner as the metal layer 108).

The conductive layer 602 is disposed below both the insulating layer 106 and the device layer 104. The conductive layer 602 is or comprises a conductive material. For example, in some embodiments, the conductive layer 602 is or comprises a doped semiconductor material (e.g., doped silicon (Si), doped germanium (Ge), etc.), a metal (e.g., Cu, Al, W, Au, Ag, Pt, etc.), a non-metal conductive material, some other conductive material, or a combination of the foregoing. In further embodiments, the conductive layer 602 is a doped semiconductor material having a doping concentration of a type of dopants (e.g., n-type dopants or p-type dopants) that is greater than or equal to about $1 \times 10^{15}$ atoms per cubic centimeter (atoms/cm$^3$). In yet further embodiments, the conductive layer 602 may further reduce a cost to fabricate the IC.

FIGS. 7-15 illustrate a series of cross-sectional views 700-1500 of some embodiments of a method for forming an integrated chip (IC) comprising a low-cost SOI structure 102. Although FIGS. 7-15 are described with reference to a method, it will be appreciated that the structures shown in FIGS. 7-15 are not limited to the method but rather may stand alone separate of the method.

Figure 7:
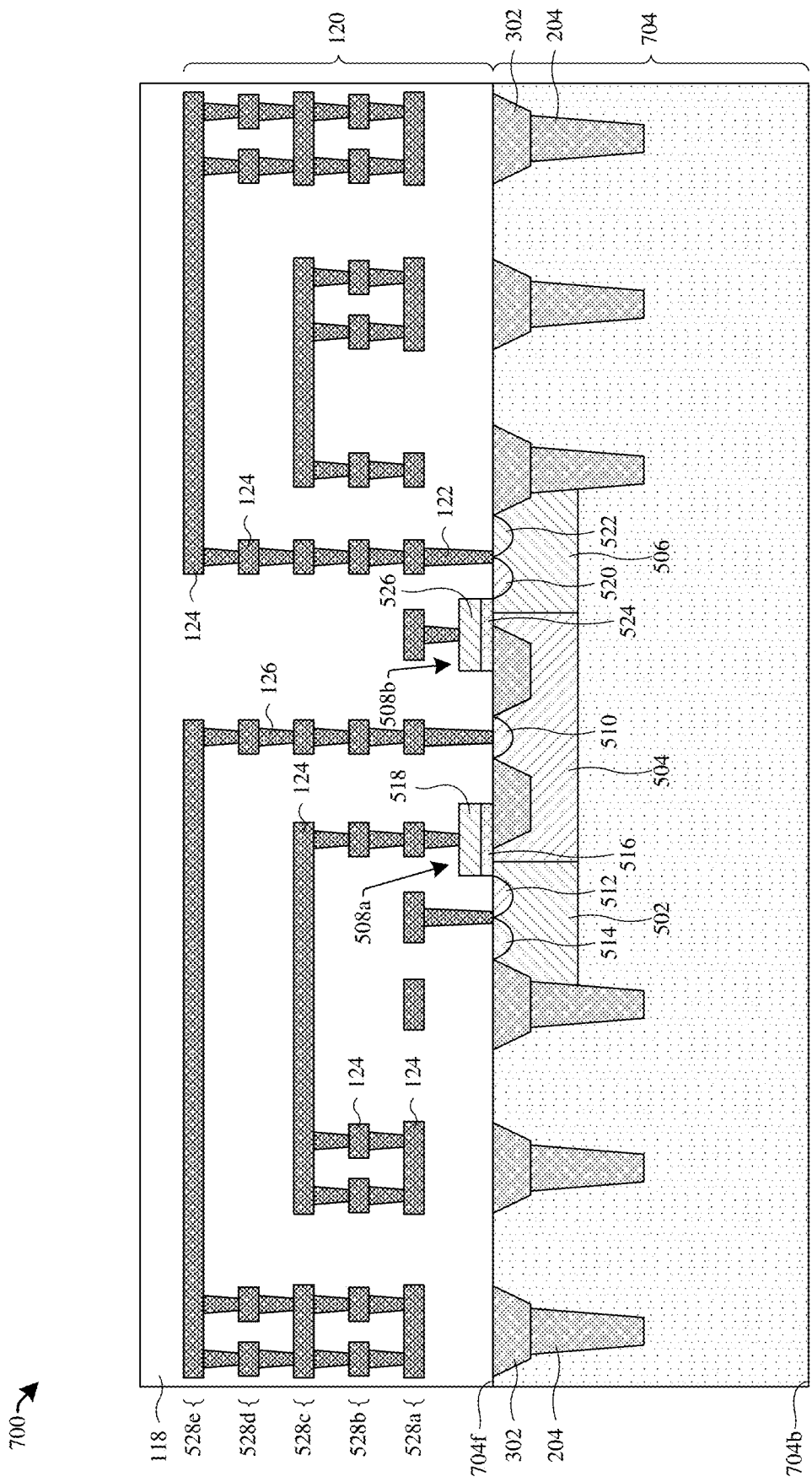
FIGS. 7-15 illustrate a series of cross-sectional views of some embodiments of a method for forming an IC comprising a low-cost SOI structure.

As shown in the cross-sectional view 700 of FIG. 7, a workpiece 702 is received. The workpiece 702 comprises a device substrate 704. The device substrate 704 has a front-side 704f and a back-side 704b opposite the front-side 704f. The semiconductor material may be or comprise, for example, silicon (Si), germanium (Ge), silicon-germanium (SiGe), gallium arsenide (GaAs), some other semiconductor material, or a combination of the foregoing. In some embodiments, the device substrate 704 is silicon (Si). In further embodiments, the device substrate 704 is monocrystalline silicon. In some embodiments, the device substrate 704 has a thickness greater than about 15 micrometers (μm). In further embodiments, the thickness of the device substrate 704 is about 750 μm. The device substrate 704 is a bulk semiconductor material.

A plurality of first isolation structures 204 are formed in the device substrate 704. A plurality of third isolation structures 302 are also formed in the device substrate 704. Further, a first well region 502, a second well region 504, and a third well region 506 are formed in the device substrate 704. A plurality of semiconductor devices 508a-b are formed on/over the device substrate 704. For example, a first semiconductor device 508a and a second semiconductor device 508b are formed on/over the device substrate 704. In some embodiments, the first semiconductor device 508a and the second semiconductor device 508b share a common drain region 510. The first semiconductor device 508a also comprises a source region 512, a body contact region 514, a gate dielectric 516, and a gate electrode 518. The second semiconductor device 508b also comprises a source region 520, a body contact region 522, a gate dielectric 524, and a gate electrode 526.

An interlayer dielectric (ILD) structure 118 is formed over both the plurality of semiconductor devices 508a-b and the device substrate 704. An interconnect structure 120 is formed in the ILD structure 118 and over the device substrate 704. The interconnect structure 120 comprises a plurality of conductive contacts 122, a first plurality of conductive lines 124, and a plurality of conductive vias 126. The first plurality of conductive lines 124 are disposed in a plurality of conductive layers 528a-e. For example, the plurality of conductive layers 528a-e comprises a first conductive layer 528a, a second conductive layer 528b, a third conductive layer 528c, a fourth conductive layer 528d, and a fifth conductive layer 528e disposed in the ILD structure 118. The plurality of first isolation structures 204, the plurality of third isolation structures 302, the first well region 502, the second well region 504, the third well region 506, the plurality of semiconductor devices 508a-b, the ILD structure 118, and the interconnect structure 120 may be formed by known complementary metal-oxide-semiconductor (CMOS) processes.

Figure 8:
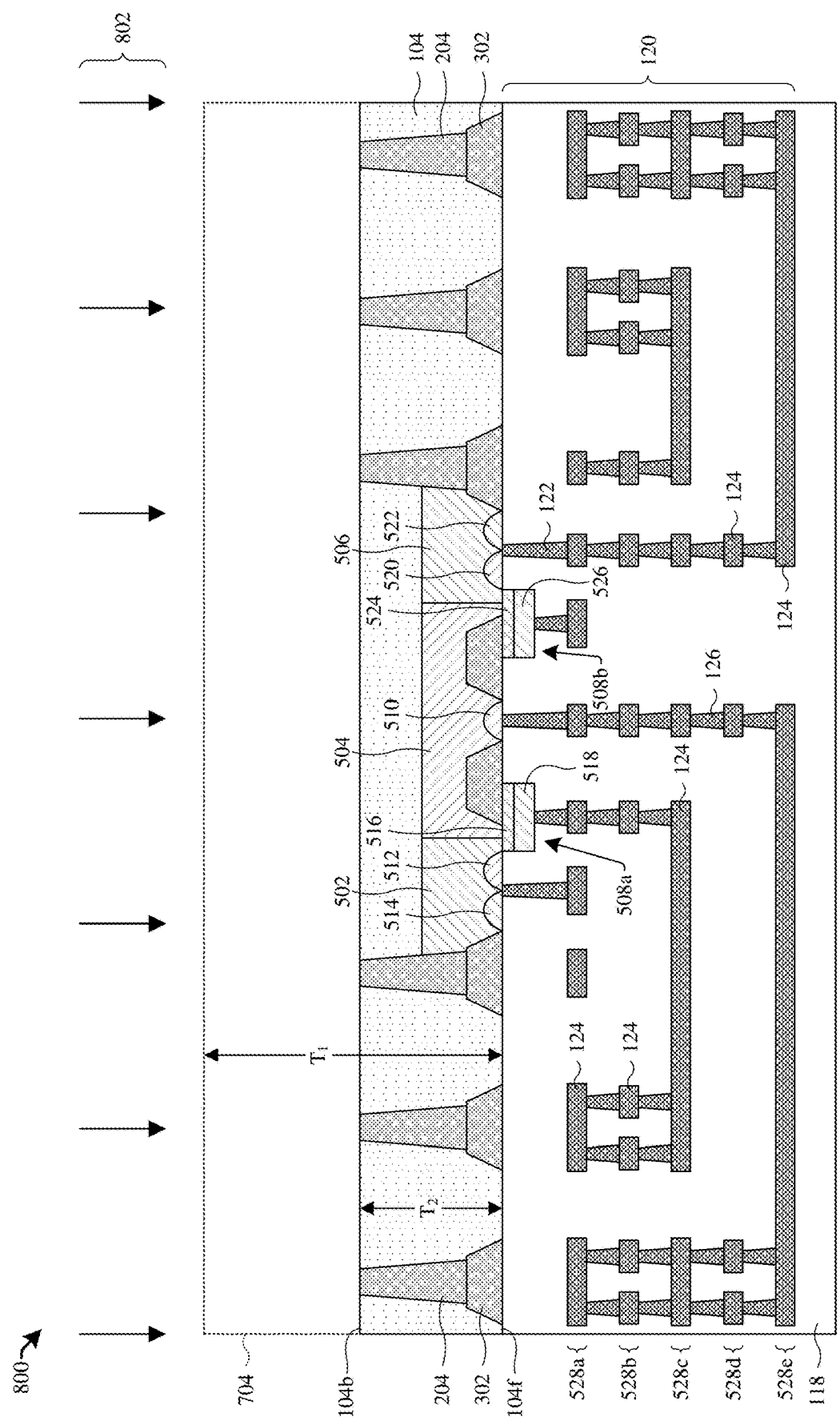

As shown in the cross-sectional view 800 of FIG. 8, the device substrate 704 (see, FIG. 7) is thinned to form a device layer 104. The device substrate 704 is thinned by performing a thinning process 802 on the back-side 704b (see, FIG. 7) of the device substrate 704 to reduce the thickness of the low-cost SOI structure 102 from a first thickness $T_1$ to a second thickness $T_2$. The first thickness $T_1$ is greater than about 15 μm. In some embodiments, the first thickness $T_1$ is about 750 μm. In further embodiments, the second thickness $T_2$ is between about 2 μm and about 15 μm. The device layer 104 corresponds to a portion of the device substrate 704 that remains after the thinning process 802. The device layer 104 has a front-side 104f and a back-side 104b. In some embodiments, the thinning process 802 may be or comprise, for example, a chemical mechanical polishing (CMP) process, a mechanical grinding process, an etching process, some other thinning process, or a combination of the foregoing. The dashed line in the cross-sectional view 800 of FIG. 8 illustrates the portion of the device substrate 704 that is removed by the thinning process 802.

Figure 9:
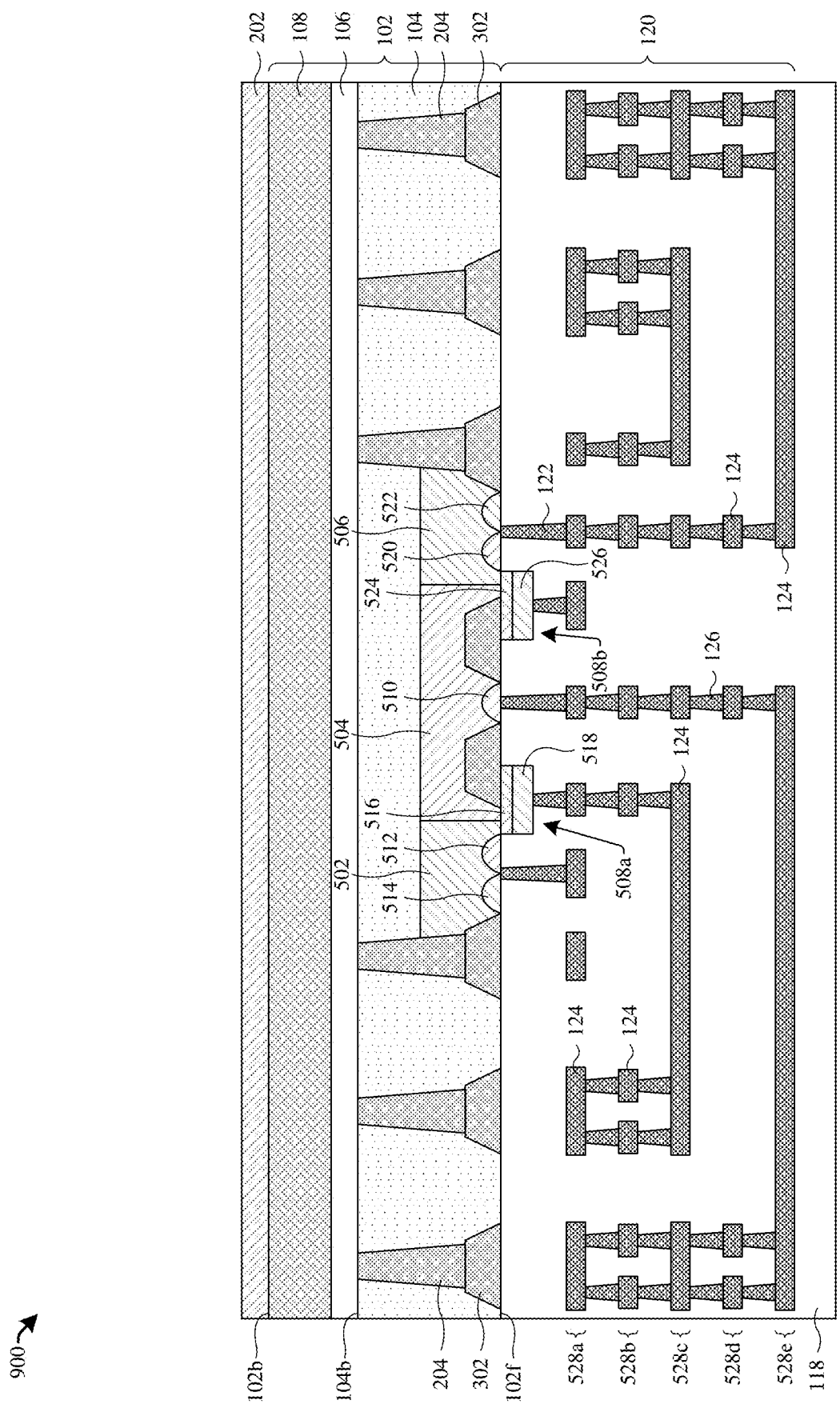

As shown in the cross-sectional view 900 of FIG. 9, an insulating layer 106 is formed over/on the back-side 104b of the device layer 104. The insulating layer 106 may be formed by, for example, chemical vapor deposition (CVD), high density plasma CVD (HDPCVD), high aspect ratio process (HARP), physical vapor deposition (PVD), atomic layer deposition (ALD), a spin-on process, some other deposition process, or a combination of the foregoing. In some embodiments, the insulating layer 106 is formed via a blanket deposition process.

Also shown in the cross-sectional view 900 of FIG. 9, a metal layer 108 is formed over/on the insulating layer 106, such that the insulating layer 106 vertically separates the metal layer 108 from the device layer 104. The metal layer 108 may be formed by, for example, CVD, HDPCVD, PVD, ALD, sputtering, electrochemical plating, electroless plating, some other deposition process, or a combination of the foregoing. In some embodiments, the metal layer 108 is formed via a blanket deposition process. In some embodiments, after the metal layer 108 is formed, formation of a low-cost SOI structure 102 is complete. The low-cost SOI structure 102 has a front-side 102f and a back-side 102b opposite the front-side 102f. The front-side 102f of the low-cost SOI structure 102 corresponded to the front-side 104f (see, FIG. 8) of the device layer 104.

It will be appreciated that, in some embodiments, the conductive layer 602 may be formed in place of the metal layer 108. More specifically, in some embodiments, the conductive layer 602 is a doped semiconductor material and is formed in place of the metal layer 108. The conductive layer 602 may be formed by, for example, CVD, HDPCVD, PVD, ALD, sputtering, an epitaxial process, some other deposition or growth process, or a combination of the foregoing. In some embodiments, by forming the conductive layer 602, a cost to fabricate the IC may be further reduced (e.g., more so than forming the IC in the described manner with the metal layer 108). More specifically, in some embodiments, it may cost less to form the low-cost SOI structure 102 due to a cost to form the doped semiconductor material being less than a cost to form the metal layer 108.

Also shown in the cross-sectional view 900 of FIG. 9, a dielectric layer 202 is formed over/on the metal layer 108, such that the metal layer 108 vertically separates the dielectric layer 202 from the insulating layer 106. The dielectric layer 202 may be formed by, for example, CVD, HDPCVD, HARP, PVD, ALD, a spin-on process, some other deposition process, or a combination of the foregoing. In some embodiments, the dielectric layer 202 is formed via a blanket deposition process.

Figure 10:
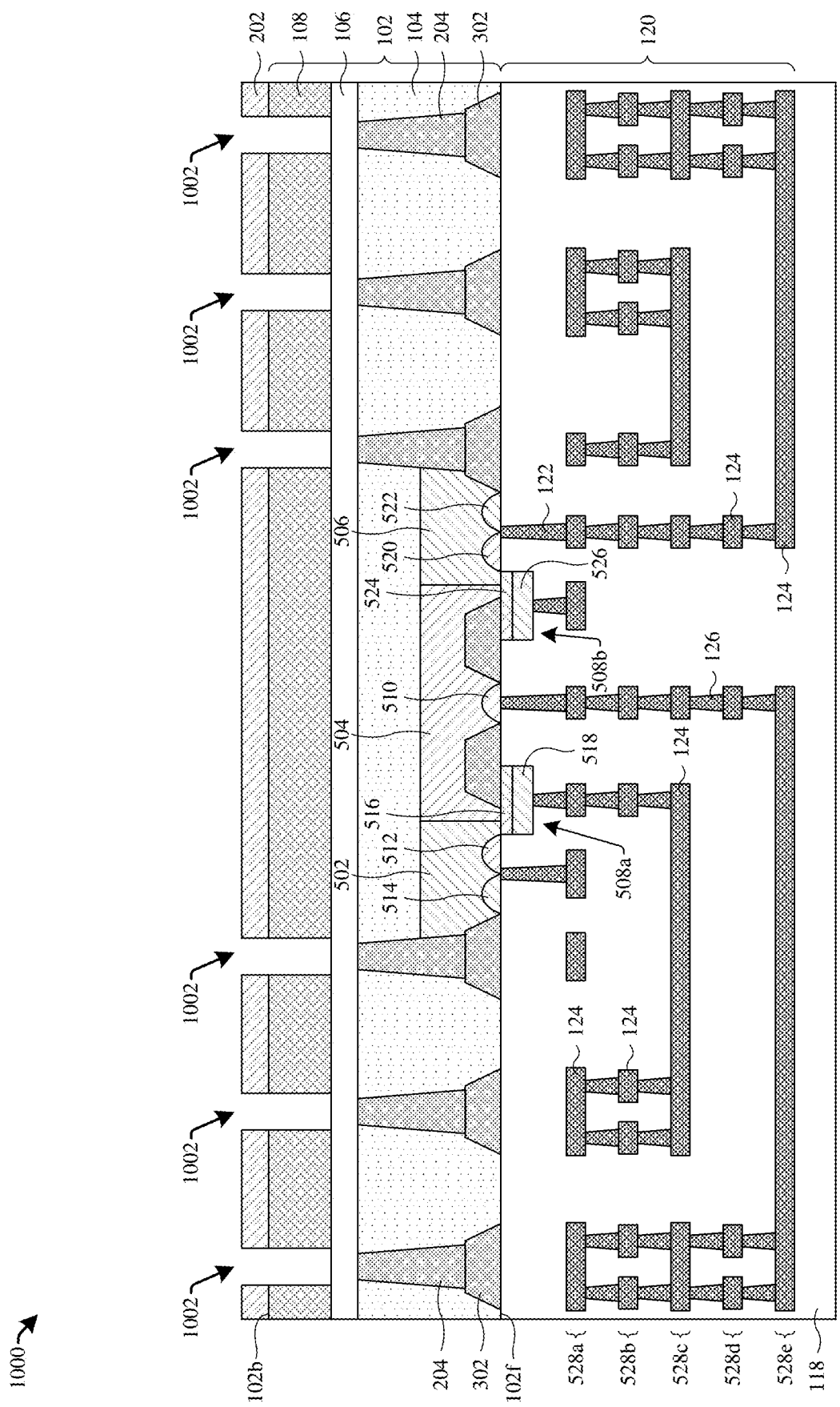

As shown in the cross-sectional view 1000 of FIG. 10, a plurality of first openings 1002 are formed in low-cost SOI structure 102. The first openings 1002 extend vertically into the low-cost SOI structure 102 from the back-side 102b of the low-cost SOI structure 102. The first openings 1002 extend vertically through both the dielectric layer 202 and the metal layer 108. The first openings 1002 extend vertically to the insulating layer 106. The first openings 1002 expose portions of the insulating layer 106, respectively. In some embodiments, the first openings 1002 and the first isolation structures 204 are laterally aligned (e.g., centered laterally), respectively.

In some embodiments, a process for forming the first openings 1002 comprises forming a patterned masking layer (not shown) (e.g., positive/negative photoresist, a hardmask, etc.) over the dielectric layer 202. The patterned masking layer may be formed by forming a masking layer (not shown) on the dielectric layer 202 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the dielectric layer 202 and the metal layer 108 to selectively etch the dielectric layer 202 and the metal layer 108 according to the patterned masking layer. The etching process removes unmasked portions of the dielectric layer 202 and unmasked portions of the metal layer 108, thereby forming the first openings 1002. In some embodiments, the etching process may be or comprise, for example, a wet etching process, a dry etching process, a reactive ion etching (RIE) process, some other etching process, or a combination of the foregoing. In further embodiments, the etching process stops on the insulating layer 106 (e.g., the insulating layer 106 acts as an etch stop layer during the etching process).

Figure 11:
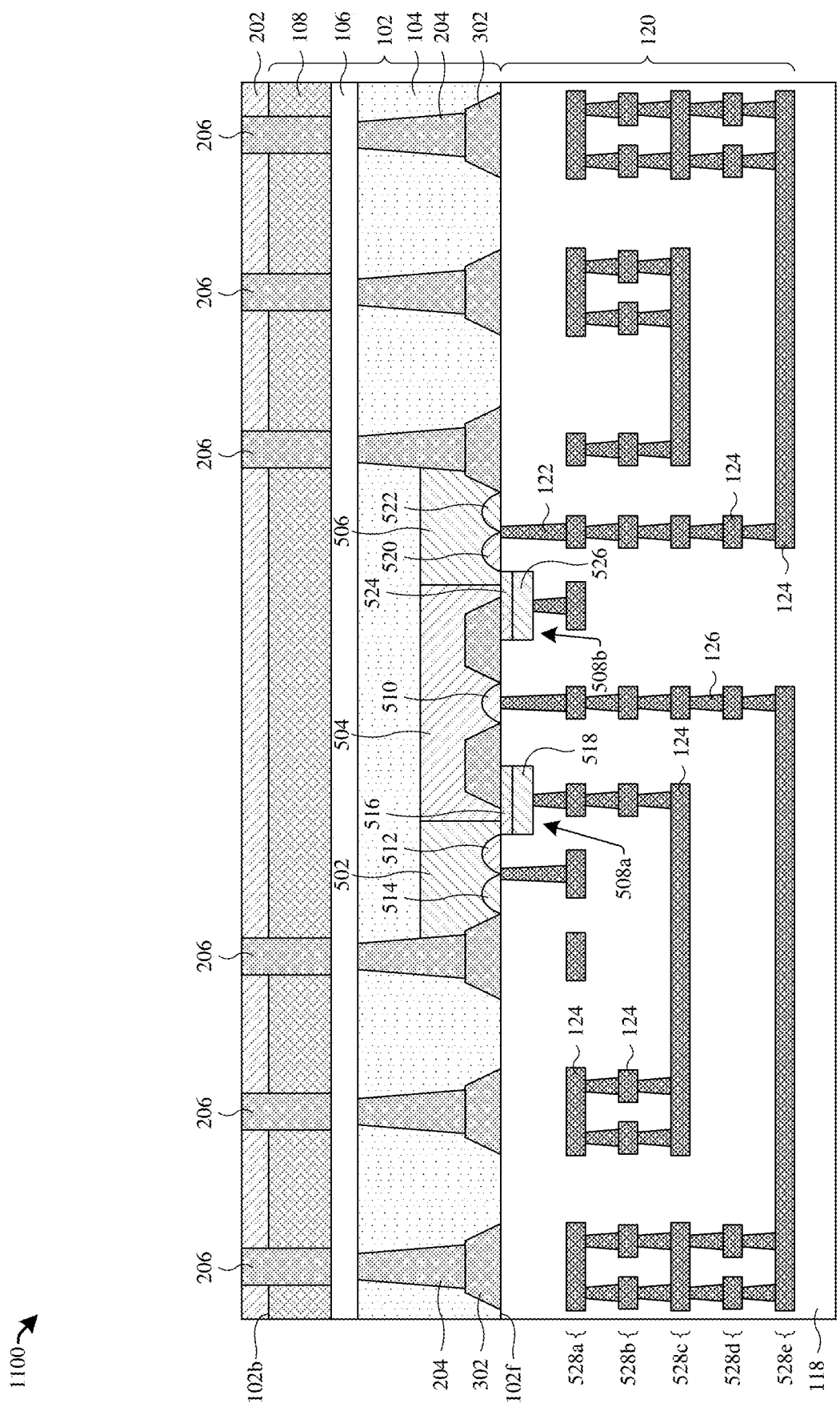

As shown in the cross-sectional view 1100 of FIG. 11, a plurality of second isolation structures 206 are formed in the plurality of first openings 1002 (see, FIG. 9), respectively. The plurality of second isolation structures 206 extend vertically into the low-cost SOI structure 102 from the back-side 102b of the low-cost SOI structure 102. The plurality of second isolation structures 206 extend vertically through both the dielectric layer 202 and the metal layer 108. The plurality of second isolation structures 206 extend vertically to the insulating layer 106. In some embodiments, the plurality of second isolation structures 206 and the first isolation structures 204 are laterally aligned (e.g., centered laterally), respectively.

In some embodiments, a process for forming the plurality of second isolation structures 206 comprises filling the first openings 1002 with a dielectric material. In some embodiments, a process for filling the first openings 1002 with the dielectric material comprises depositing the dielectric material on the dielectric layer 202 and in the first openings 1002. The dielectric material may be or comprise, for example, an oxide (e.g., SiO2), a nitride (e.g., SiN), an oxy-nitride (e.g., SiON), a carbide (e.g., SiC), some other dielectric material, or a combination of the foregoing. The dielectric material may be deposited by, for example, CVD, PVD, ALD, some other deposition process, or a combination of the foregoing. In some embodiments, after the dielectric material is deposited, a planarization process (e.g., CMP) is performed on the dielectric material to remove an upper portion of the dielectric material, thereby leaving lower portions of the dielectric material in the first openings 1002 as the plurality of second isolation structures 206. In further embodiments, the planarization process co-planarizes an upper surface of the dielectric layer 202 and upper surfaces of the plurality of second isolation structures 206.

Figure 12:
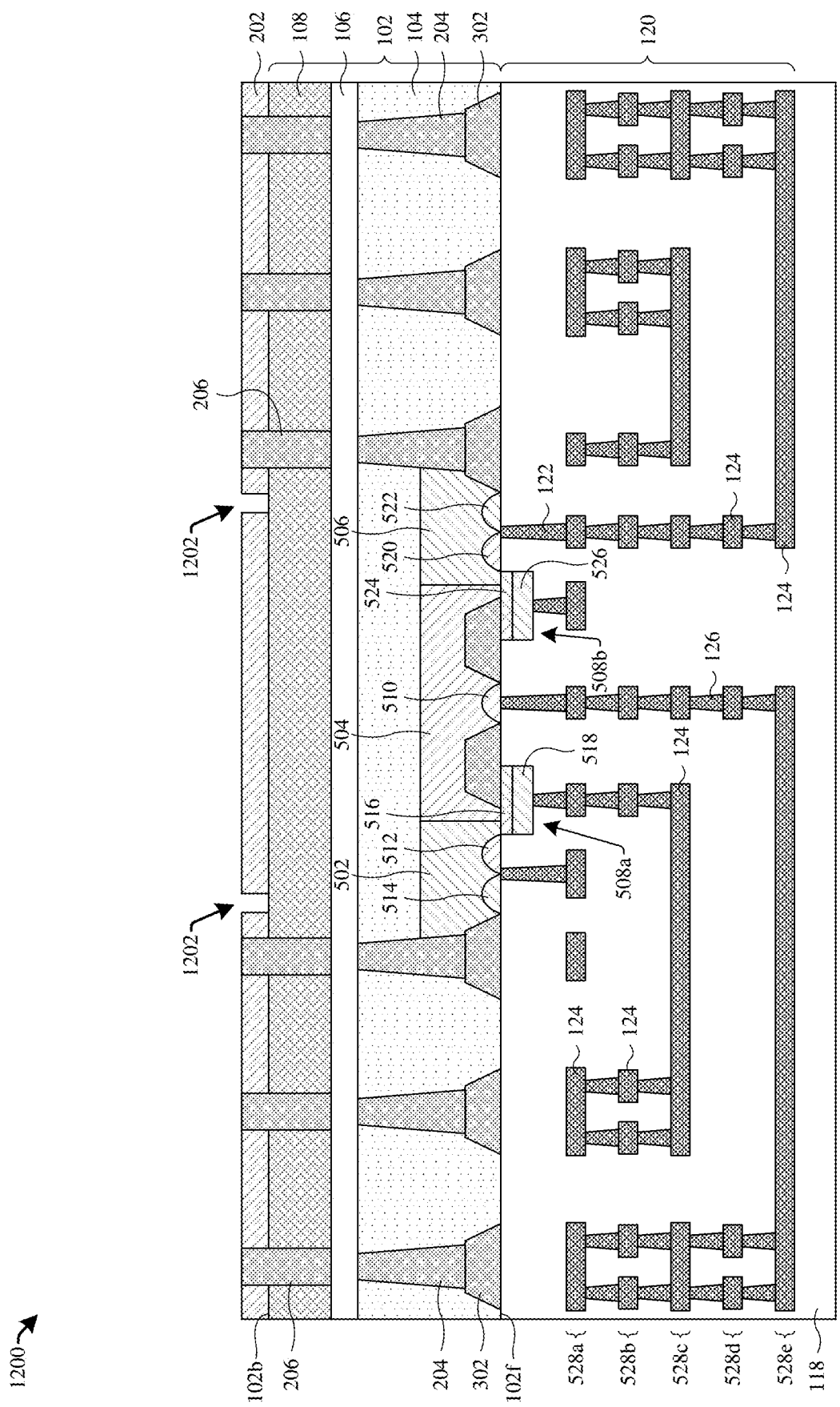

As shown in the cross-sectional view 1200 of FIG. 12, a plurality of second openings 1202 are formed in the dielectric layer 202. The second openings 1202 extend vertically through the dielectric layer 202 to the metal layer 108. The second openings 1202 expose portions of metal layer 108, respectively.

In some embodiments, a process for forming the second openings 1202 comprises forming a patterned masking layer (not shown) (e.g., positive/negative photoresist, a hardmask, etc.) over the dielectric layer 202 and the second isolation structures 206. The patterned masking layer may be formed by forming a masking layer (not shown) on the dielectric layer 202 and on the second isolation structures 206 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the dielectric layer 202 to selectively etch the dielectric layer 202 according to the patterned masking layer. The etching process removes unmasked portions of the dielectric layer 202, thereby forming the second openings 1202. In some embodiments, the etching process may be or comprise, for example, a wet etching process, a dry etching process, a RIE process, some other etching process, or a combination of the foregoing. In further embodiments, the etching process stops on the metal layer 108 (e.g., the metal layer 108 acts as an etch stop layer during the etching process).

Figure 13:
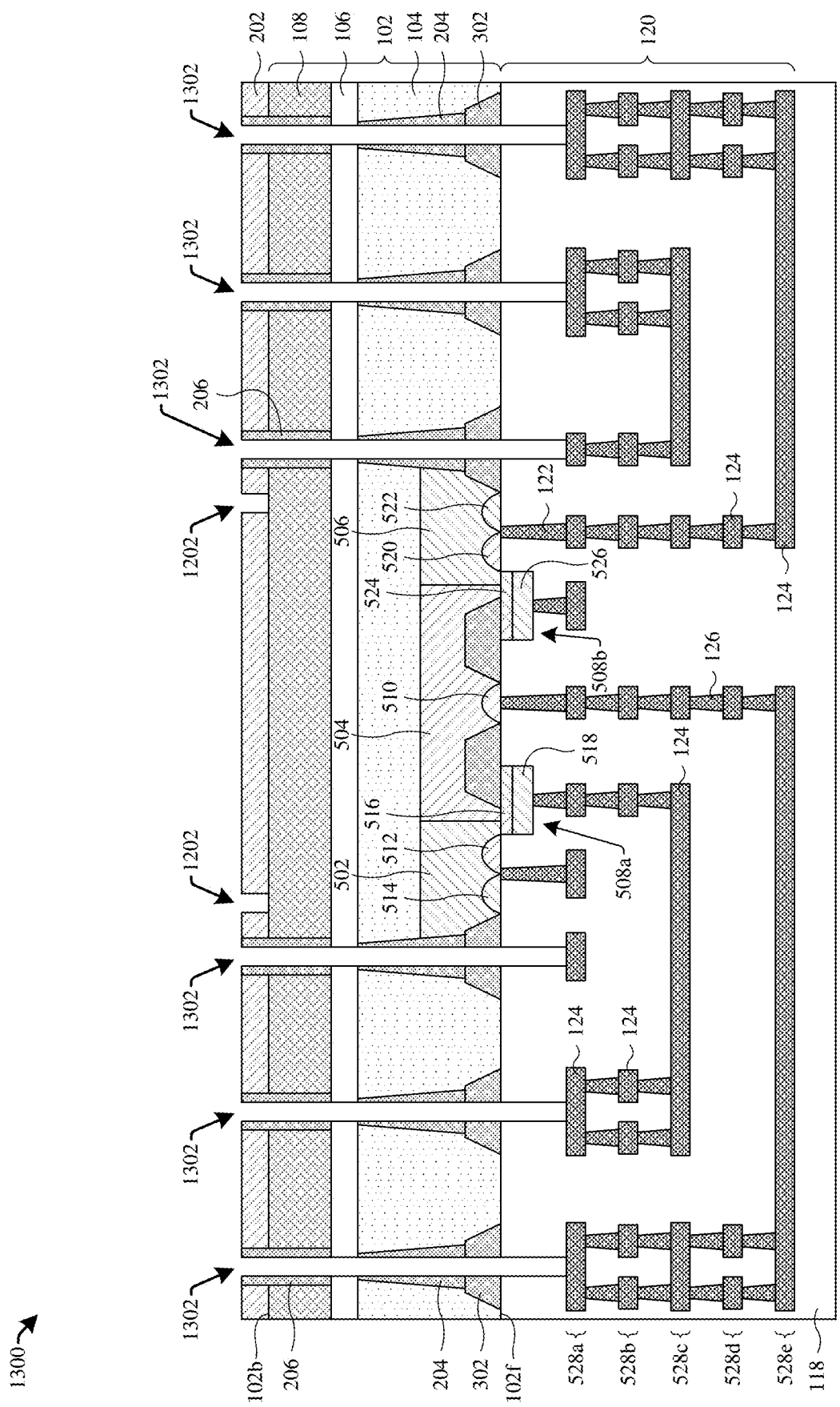

As shown in the cross-sectional view 1300 of FIG. 13, a plurality of third openings 1302 are formed in the dielectric layer 202, the low-cost SOI structure 102, and the ILD structure 118. The third openings 1302 extend vertically into the dielectric layer 202. The third openings 1302 also extend vertically into the low-cost SOI structure 102 from the back-side 102b of the low-cost SOI structure 102. The third openings 1302 also extend vertically through a portion of the ILD structure 118 to corresponding conductive features of the interconnect structure 120. For example, the third openings 1302 extend vertically through the portion of the ILD structure 118 to corresponding conductive lines of the first conductive layer 528a. The third openings 1302 expose a portion of their corresponding conductive line of the first conductive layer 528a. For example, one of the third openings 1302 extends vertically through the low-cost SOI structure 102 and the portion of the ILD structure 118 to one of the conductive lines of the first conductive layer 528a, thereby exposing a portion of the one of the conductive lines of the first conductive layer 528a.

The third openings 1302 also extend vertically through portions of the insulating layer 106 that were exposed by forming the first openings 1002. Further, the third openings 1302 extend vertically through the second isolation structures 206, respectively. In other words, the third openings 1302 extend through the dielectric layer 202 and the metal layer 108 by extending vertically through the second isolation structures 206. The second isolation structures 206 laterally surround the third openings 1302, respectively. The third openings 1302 also extend vertically through the insulating layer 106.

In addition, the third openings 1302 extend vertically through the first isolation structures 204, respectively. Moreover, the third openings 1302 may extend vertically through the third isolation structures 302, respectively. In other words, the third openings 1302 extend through the device layer 104 by extending vertically through the first isolation structures 204 and the third isolation structures 302. The first isolation structures 204 laterally surround the third openings 1302, respectively. The third isolation structures 302 laterally surround the third openings 1302, respectively.

In some embodiments, a process for forming the third openings 1302 comprises forming a patterned masking layer (not shown) (e.g., positive/negative photoresist, a hardmask, etc.) over the dielectric layer 202, the second isolation structures 206, and the second openings 1202. The patterned masking layer may be formed by forming a masking layer (not shown) on the dielectric layer 202, on the second isolation structures 206, and in the second openings 1202 (e.g., via a spin-on process); exposing the masking layer to a pattern (e.g., via a lithography process, such as photolithography, extreme ultraviolet lithography, or the like); and developing the masking layer to form the patterned masking layer. Thereafter, with the patterned masking layer in place, an etching process is performed on the second isolation structures 206, the insulating layer 106, the first isolation structure 204, the third isolation structures 302, and a portion of the ILD structure 118 according to the patterned masking layer. The etching process removes unmasked portions of the second isolation structures 206, unmasked portions of the insulating layer 106, unmasked portions of the first isolation structure 204, unmasked portions of the third isolation structures 302, and unmasked portions of the portion of the ILD structure 118, thereby forming the third openings 1302. In some embodiments, the etching process may be or comprise, for example, a wet etching process, a dry etching process, a RIE process, some other etching process, or a combination of the foregoing. In further embodiments, the etching process stops on the corresponding conductive lines of the first conductive layer 528a (e.g., the corresponding conductive lines of the first conductive layer 528a act as etch stop structures during the etching process).

Figure 14:
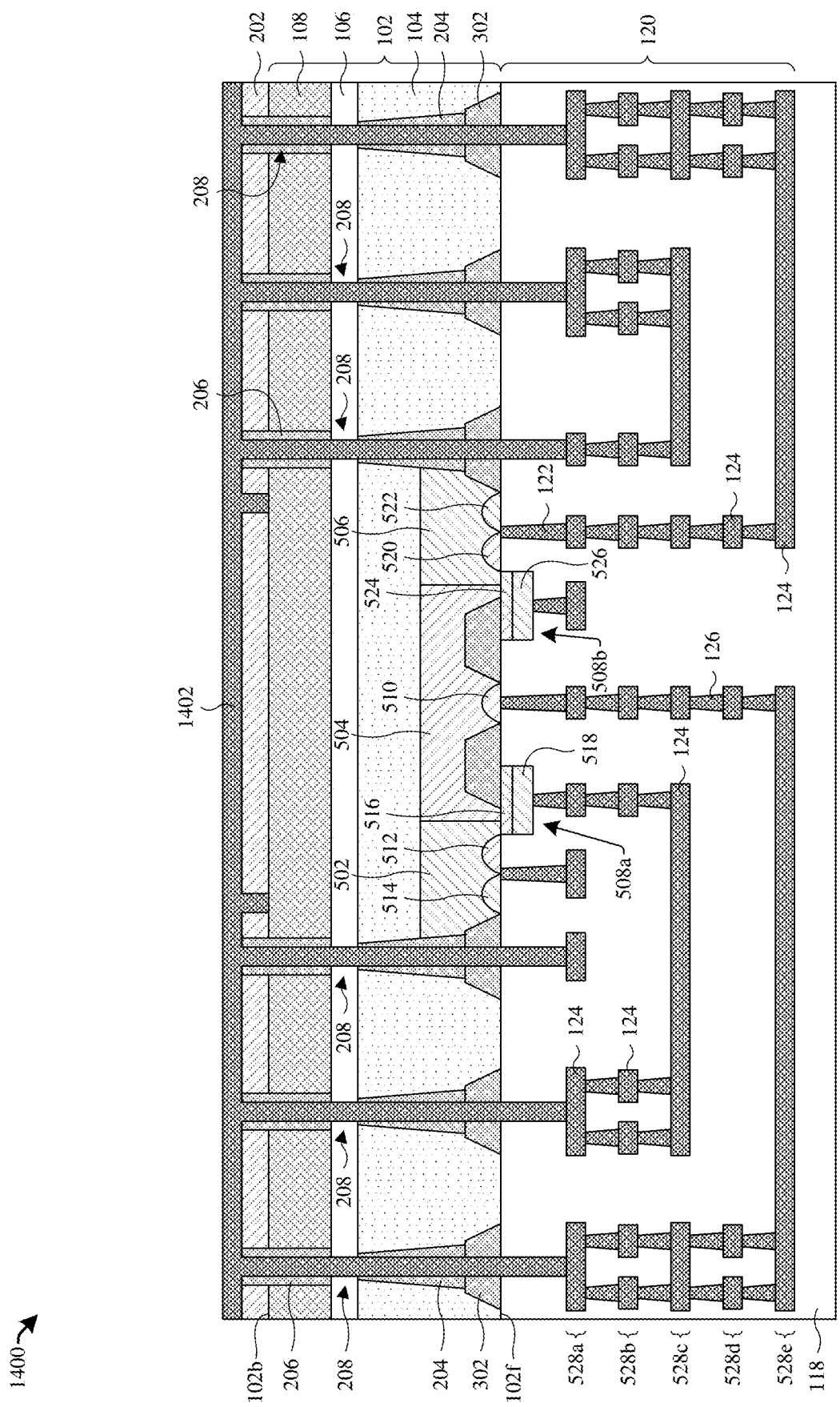

As shown in the cross-sectional view 1400 of FIG. 14, a conductive material 1402 is formed on the dielectric layer 202 and in the third openings 1302 (see, FIG. 13). The conductive material 1402 is formed so that the conductive material 1402 fills the third openings 1302. By filling the third openings 1302 with the conductive material 1402, a plurality of through-substrate vias (TSVs) 208 are formed. In other words, the plurality of TSVs 208 are formed in the third openings 1302, respectively. The plurality of TSVs 208 extend vertically through the dielectric layer 202, the low-cost SOI structure 102, and the portion of the ILD structure 118 to the corresponding conductive lines of the first conductive layer 528a. The plurality of TSVs 208 also extend through corresponding second isolation structures 206, first isolation structure 204, and third isolation structures 302. The plurality of TSVs 208 are electrically coupled to their corresponding conductive line of the first conductive layer 528a.

In some embodiments, the conductive material 1402 is or comprises, for example, copper (Cu), aluminum (Al), gold (Au), silver (Ag), platinum (Pt), polysilicon, some other conductive material, or a combination of the foregoing. In further embodiments, the conductive material 1402 is referred to as a metal material. In some embodiments, a process for forming the conductive material comprises depositing the conductive material 1402 on the dielectric layer 202 and in the third openings 1302, such that the third openings 1302 are filled with the conductive material 1402. The conductive material 1402 may be deposited by, for example, CVD, HDPCVD, PVD, ALD, sputtering, electrochemical plating, electroless plating, some other deposition process, or a combination of the foregoing.

Figure 15:
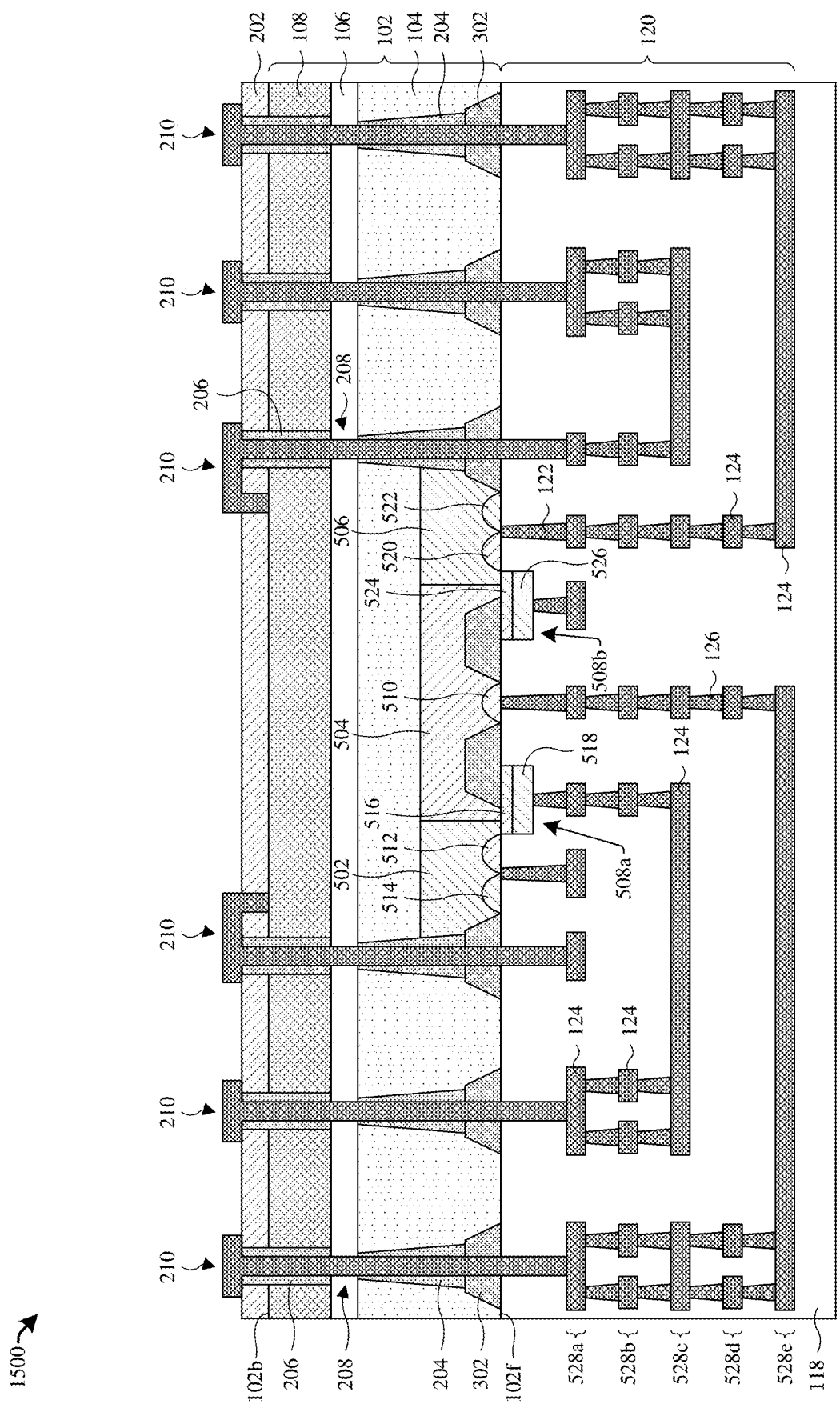

As shown in the cross-sectional view 1500 of FIG. 15, a second plurality of conductive lines 210 (e.g., metal lines) are formed over/on the dielectric layer 202, the TSVs 208, and the second isolation structures 206. The second plurality of conductive lines 210 are electrically coupled to the plurality of TSVs 208, respectively. In some embodiments, one or more of the second plurality of conductive lines 210 are also electrically coupled to the metal layer 108.

In some embodiments, a process for forming the second plurality of conductive lines 210 comprises forming a patterned masking layer (not shown) (e.g., positive/negative photoresist, a hardmask, etc.) over the conductive material 1402 (see, FIG. 14). The patterned masking layer may be formed by forming a masking layer (not shown) on the conductive material 1402 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the conductive material 1402 to selectively etch the conductive material 1402 according to the patterned masking layer. The etching process removes unmasked portions of the conductive material 1402, thereby forming the second plurality of conductive lines 210. In some embodiments, the etching process may be or comprise, for example, a wet etching process, a dry etching process, a RIE process, some other etching process, or a combination of the foregoing. In further embodiments, the etching process stops on the dielectric layer 202 (e.g., the dielectric layer 202 acts as an etch stop layer during the etching process). It will be appreciated that the second plurality of conductive lines 210 (and/or the plurality of TSVs 208) may be formed by other suitable processes (e.g., a damascene process). It will be appreciated that, after the second plurality of conductive lines 210 are formed, a plurality of input/output (I/O) structures (e.g., bond pads, solder bumps, etc.) may be formed below (or in plane) with and electrically coupled to the second plurality of conductive lines 210, respectively.

Figure 16:
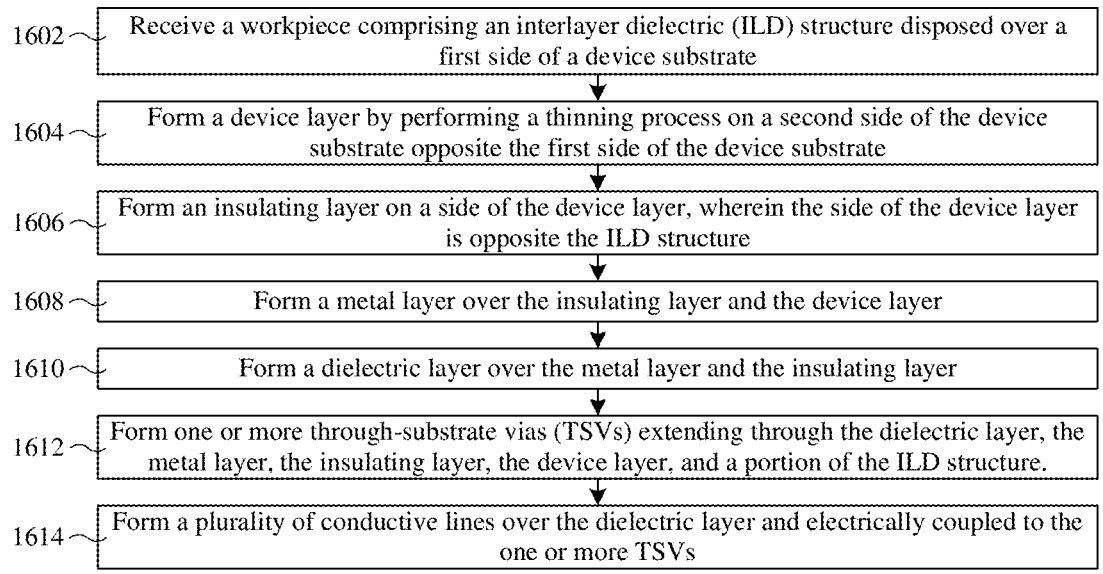
FIG. 16 illustrates a flowchart of some embodiments of a method for forming an IC comprising a low-cost SOI structure.

FIG. 16 illustrates a flowchart 1600 of some embodiments of a method for forming an integrated chip (IC) comprising a low-cost SOI structure. While the flowchart 1600 of FIG. 16 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1602, a workpiece comprising an interlayer dielectric (ILD) structure disposed over a first side of a device substrate is received. FIG. 7 illustrates a cross-sectional view 700 of some embodiments corresponding to act 1602.

At act 1604, a device layer is formed by performing a thinning process on a second side of the device substrate opposite the first side of the device substrate. FIG. 8 illustrates a cross-sectional view 800 of some embodiments corresponding to act 1604.

At act 1606, an insulating layer is formed on a side of the device layer, wherein the side of the device layer is opposite the ILD structure. FIG. 9 illustrates a cross-sectional view 900 of some embodiments corresponding to act 1606.

At act 1608, a metal layer is formed over the insulating layer and the device layer. FIG. 9 illustrates a cross-sectional view 900 of some embodiments corresponding to act 1608.

At act 1610, a dielectric layer is formed over the metal layer and the insulating layer. FIG. 9 illustrates a cross-sectional view 900 of some embodiments corresponding to act 1610.

At act 1612, one or more through-substrate vias (TSVs) are formed extending through the dielectric layer, the metal layer, the insulating layer, the device layer, and a portion of the ILD structure. FIGS. 10-14 illustrate a series of cross-sectional views 1000-1400 of some embodiments corresponding to act 1612.

At act 1614, a plurality of conductive lines are formed over the dielectric layer and electrically coupled to the one or more TSVs. FIG. 15 illustrates a cross-sectional view 1500 of some embodiments corresponding to act 1614.

In some embodiments, the present application provides an integrated chip (IC). The IC comprises a substrate. The substrate comprises a metal layer, a device layer disposed over the metal layer, and an insulating layer disposed vertically between the metal layer and the device layer. The device layer is a semiconductor material. A semiconductor device is disposed on the device layer. An interlayer dielectric (ILD) layer is disposed over the semiconductor device and the substrate.

In some embodiments, the present application provides an integrated chip (IC). The IC comprises a substrate. The substrate comprises a conductive layer, a device layer disposed over the conductive layer, and an insulating layer disposed vertically between the conductive layer and the device layer. The device layer is a semiconductor material. A semiconductor device is disposed on the device layer. An interlayer dielectric (ILD) layer is disposed over the semiconductor device and the substrate. A conductive interconnect structure is embedded in the ILD structure and disposed over the substrate, wherein the conductive interconnect structure comprises a group of conductive lines that define a first layer of conducive lines. A first conductive structure extends vertically through the ILD structure, the device layer, and the insulating layer, wherein the first conductive structure electrically couples a first conductive line of the group of conductive lines to the conductive layer.

In some embodiments, the present application provides a method for forming an integrated chip (IC). The method comprises receiving a workpiece, wherein the workpiece comprises a semiconductor device over a device substrate and comprises an interlayer dielectric (ILD) structure over the semiconductor device and over a first side of the device substrate, wherein the device substrate is a semiconductor material. A device layer is formed by performing a thinning process on a second side of the device substrate that reduces a thickness of the device substrate, wherein the second side of the device substrate is opposite the first side of the device substrate. After the thinning process, an insulating layer is formed on a side of the device layer, wherein the side of the device layer is opposite the ILD structure. A metal layer is formed on the insulating layer, such that the insulating layer vertically separates the metal layer from the device layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an integrated chip (IC), the method comprising:
   receiving a workpiece, wherein the workpiece comprises a semiconductor device over a device substrate and comprises an interlayer dielectric (ILD) structure over the semiconductor device and over a first side of the device substrate, wherein the device substrate is a semiconductor material;
   forming a device layer by performing a thinning process on a second side of the device substrate that reduces a thickness of the device substrate, wherein the second side of the device substrate is opposite the first side of the device substrate;
   after the thinning process, forming an insulating layer on a side of the device layer, wherein the side of the device layer is opposite the ILD structure; and
   forming a metal layer on the insulating layer, such that the insulating layer vertically separates the metal layer from the device layer;
   forming a dielectric layer on the metal layer, such that the metal layer vertically separates the dielectric layer from the insulating layer;
   forming a first opening that extends vertically through the dielectric layer and vertically through the metal layer, wherein the first opening exposes a portion of the insulating layer;
   forming a first isolation structure in the first opening by filling the opening with a dielectric material;
   forming a second opening that extends vertically through the first isolation structure, the portion of the insulating layer, the device layer, and the ILD structure; and
   forming a first through-substrate via (TSV) in the second opening.

2. The method of claim 1, wherein a first side of the insulating layer directly contacts the metal layer and a second side of the insulating layer directly contacts the device layer, the second side being opposite the first side.

3. The method of claim 1, wherein the ILD structure and the insulating layer comprise a same material.

4. The method of claim 1, wherein the device layer has a thickness ranging between about 2 micrometers (μm) and about 15 μm.

5. The method of claim 1, further comprising:
   forming a first metal wire within the dielectric layer, wherein a portion of the dielectric layer vertically separates the first metal wire from the metal layer.

6. The method of claim 5, wherein the first metal wire is electrically coupled to the first TSV.

7. The method of claim 6, wherein the first metal wire comprises:
   a lateral portion that extends laterally below the dielectric layer from the first TSV to a first location; and
   a vertical portion that extends from the first location vertically through the dielectric layer to the metal layer, such that the first metal wire electrically couples the first TSV to the metal layer.

8. The method of claim 7, further comprising:
   forming a second TSV extending through the device layer and the dielectric layer, wherein the second TSV is laterally spaced from the first TSV; and
   forming a second metal wire electrically coupled to the second TSV and disposed below the dielectric layer, wherein the dielectric layer vertically separates the second metal wire from the metal layer, and wherein the second metal wire is laterally spaced from the first metal wire.

9. The method of claim 1, further comprising:
   forming a second isolation structure in the device layer, wherein the first TSV extends through the second isolation structure, and wherein the second isolation structure electrically isolates the first TSV from the device layer.

10. The method of claim 9, wherein the first isolation structure has tapered outer sidewalls that define a first isolation structure width that varies along sidewalls of the first TSV.

11. The method of claim 10, wherein the second isolation structure has outer sidewalls whose sidewall angle differs from that of the tapered outer sidewalls of the first isolation structure.

12. The method of claim 9:
   wherein the first isolation structure has a bottom surface that terminates at an interface where a lower surface of the device layer meets an upper surface of the insulating layer; and
   wherein the second isolation structure has a top surface that terminates at an interface where a lower surface of the insulating layer meets an upper surface of the metal layer.

13. A method for forming an integrated chip (IC), the method comprising:
   receiving a workpiece, wherein the workpiece comprises a semiconductor device over a device substrate and comprises an interlayer dielectric (ILD) structure over the semiconductor device and over a first side of the device substrate, wherein the device substrate is a semiconductor material that includes silicon;
   forming a device layer by performing a thinning process on a second side of the device substrate that reduces a thickness of the device substrate, wherein the second side of the device substrate is opposite the first side of the device substrate;

after the thinning process, forming an insulating layer on a side of the device layer, wherein the side of the device layer is opposite the ILD structure; and forming a metal layer on the insulating layer, such that the insulating layer vertically separates the metal layer from the device layer;

forming a dielectric layer on the metal layer, such that the metal layer vertically separates the dielectric layer from the insulating layer;

forming a first opening that extends vertically through the dielectric layer and vertically through the metal layer, wherein the first opening exposes a portion of the insulating layer;

forming a first isolation structure in the first opening by filling the opening with a dielectric material;

forming a second opening that extends vertically through the first isolation structure, the portion of the insulating layer, the device layer, and the ILD structure; and forming a first through-substrate via (TSV) in the second opening.

14. The method of claim 13, wherein the metal layer is a single continuous metal body having a thickness of between 1 micrometer and 5 micrometers.

15. The method of claim 13, wherein a first side of the insulating layer directly contacts the metal layer and a second side of the insulating layer directly contacts the device layer, the second side being opposite the first side.

16. The method of claim 13, wherein the device layer has a thickness ranging between about 2 micrometers (μm) and about 15 μm.

17. The method of claim 13, further comprising:
forming a first metal wire prior to forming the dielectric layer, wherein the dielectric layer vertically separates the first metal wire from the metal layer.

18. The method of claim 13, further comprising:
forming a second isolation structure in the device layer, wherein the second isolation structure electrically isolates the first TSV from the device layer.

19. The method of claim 18:
wherein the first isolation structure has tapered outer sidewalls that are angled at a first angle relative to a lower surface of the device layer such that the first isolation structure has a first isolation structure width that varies as measured at different depths of the first TSV and as measured perpendicular to outer sidewalls of the first TSV; and wherein the second isolation structure is defined between vertical outer sidewalls that are angled at a second angle as measured relative to the lower surface of the device layer, wherein the second angle differs from the first angle.

20. A method for forming an integrated chip (IC), the method comprising:
receiving a workpiece, wherein the workpiece comprises a semiconductor device over a device substrate and comprises an interlayer dielectric (ILD) structure over the semiconductor device and over a first side of the device substrate, wherein the device substrate is a semiconductor material;

forming a device layer by performing a thinning process on a second side of the device substrate that reduces a thickness of the device substrate, wherein the second side of the device substrate is opposite the first side of the device substrate;

after the thinning process, forming an insulating layer on a side of the device layer, wherein the side of the device layer is opposite the ILD structure; and forming a metal layer on the insulating layer, such that the insulating layer vertically separates the metal layer from the device layer;

forming a dielectric layer on the metal layer, such that the metal layer vertically separates the dielectric layer from the insulating layer;

forming a first opening that extends vertically through the dielectric layer and vertically through the metal layer, wherein the first opening exposes a portion of the insulating layer;

forming an isolation structure in the first opening by filling the opening with a dielectric material;

forming a second opening that extends vertically through the isolation structure, the portion of the insulating layer, the device layer, and the ILD structure; and forming a through-substrate via (TSV) comprising copper in the second opening.

* * * * *